(12) United States Patent
Kudou et al.

(10) Patent No.: US 6,510,087 B2
(45) Date of Patent: Jan. 21, 2003

(54) SEMICONDUCTOR MEMORY DEVICE

(75) Inventors: Manami Kudou, Yokohama (JP); Kazuhide Yoneya, Sagamihara (JP); Masaru Koyanagi, Yokohama (JP); Toshiki Hisada, Yokohama (JP); Katsuki Matsudera, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/963,805

(22) Filed: Sep. 25, 2001

(65) Prior Publication Data
US 2002/0036928 A1 Mar. 28, 2002

(30) Foreign Application Priority Data
Sep. 28, 2000 (JP) ........................................ 2000-296081

(51) Int. Cl.[7] ................................................. G11C 7/00
(52) U.S. Cl. ............. 365/189.05; 365/221; 365/230.08; 365/233; 365/239
(58) Field of Search ....................... 365/189.05, 230.08, 365/233, 239, 240, 221

(56) References Cited

U.S. PATENT DOCUMENTS

| | | | | | |
|---|---|---|---|---|---|
| 4,817,054 | A | * | 3/1989 | Banerjee et al. | ............. 365/221 |
| 5,200,925 | A | * | 4/1993 | Morooka | ..................... 365/219 |
| 5,305,281 | A | * | 4/1994 | Lubeck | .................. 365/230.04 |
| 6,134,178 | A | * | 10/2000 | Yamazaki et al. | ........... 365/233 |
| 6,198,649 | B1 | | 3/2001 | Matsudera et al. | ........... 365/63 |

FOREIGN PATENT DOCUMENTS

JP    2000-029772    1/2000

* cited by examiner

*Primary Examiner*—Son T. Dinh
(74) *Attorney, Agent, or Firm*—Hogan & Harstson, LLP

(57) ABSTRACT

A semiconductor memory device comprises a memory cell array, a first latch circuit group, and a second latch circuit group. The first latch circuit group sequentially outputs n/2 bit read data of n-bit read data from the memory cell array in response to sequentially shifted read control signals. The second latch circuit group sequentially outputs the remaining n/2 bit read data in response to the sequentially shifted read control signal.

26 Claims, 20 Drawing Sheets

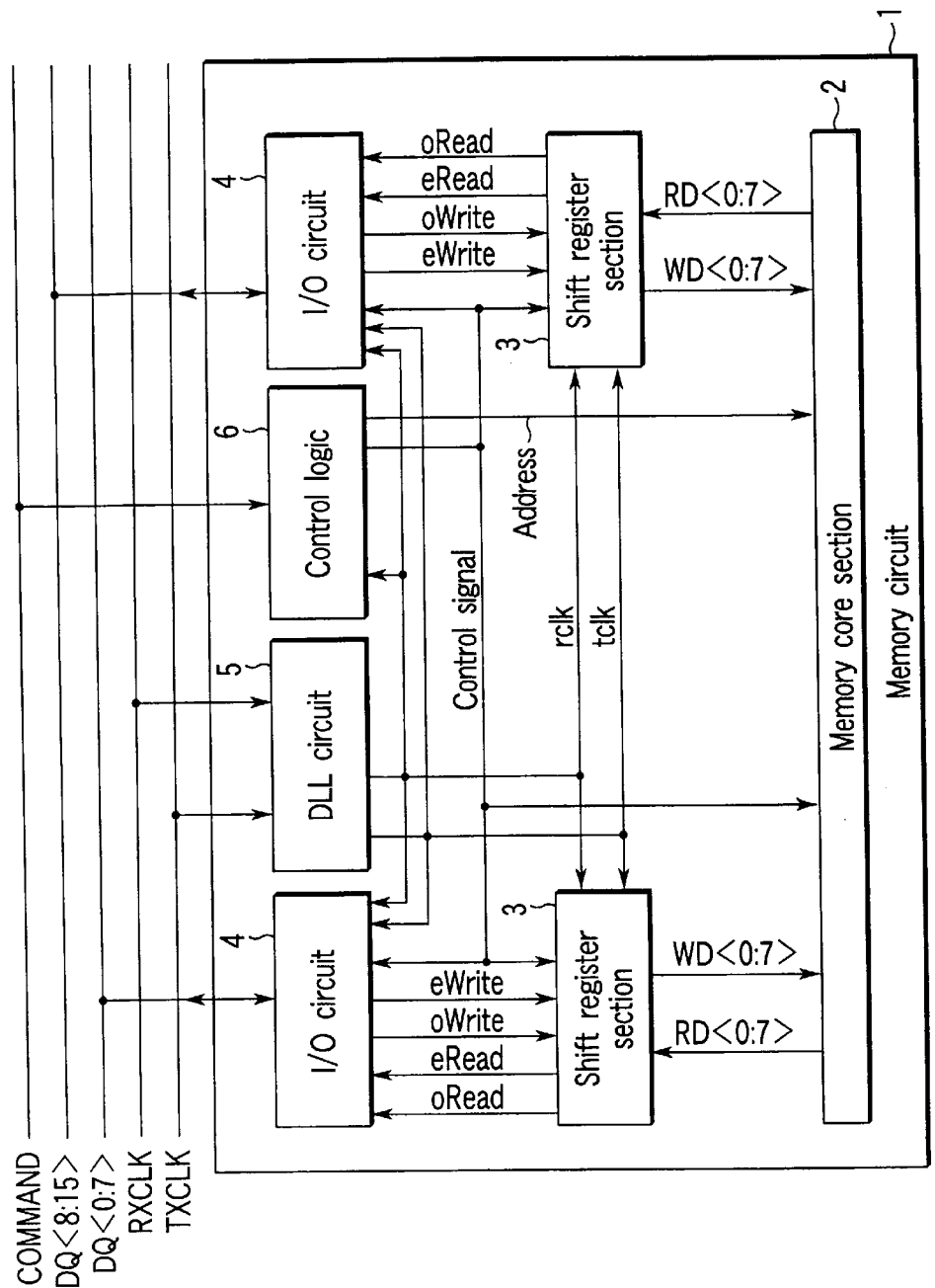
F I G. 1

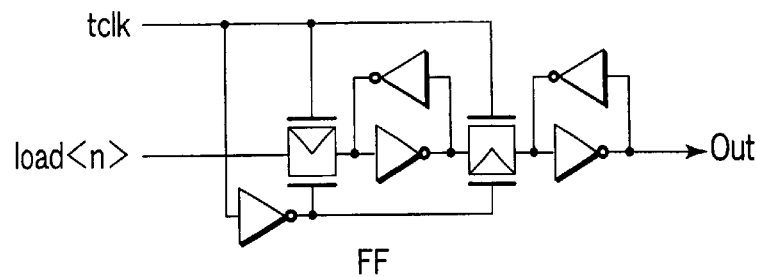
F I G. 18
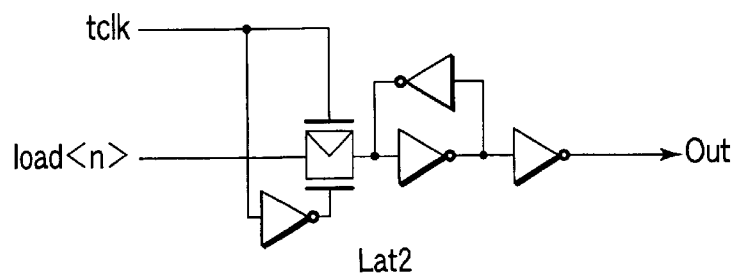
F I G. 19
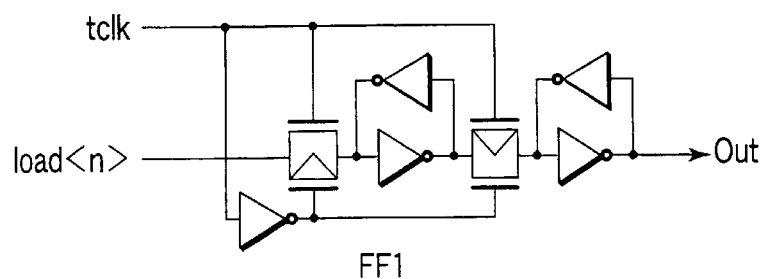
F I G. 20

SEMICONDUCTOR MEMORY DEVICE

CROSS-REFERENCE TO RELATED APPLICATIONS

This application is based upon and claims the benefit of priority from the prior Japanese Patent Application No. 2000-296081, filed Sep. 28, 2000, the entire contents of which are incorporated herein by reference.

BACKGROUND OF THE INVENTION

1. Field of the Invention

The present invention relates to a semiconductor memory device, and in particular, to a read register.

2. Description of the Related Art

A circuit configuration of a general high frequency clock synchronous memory is shown in FIG. 23. A memory circuit 1 is roughly composed of a memory core section 2 and the other interface I/F circuit.

The I/F circuit comprises: adjacent left and right shift register section 3 at the memory core section 2; left and right I/O circuits (input/output circuits) 4 disposed between the corresponding external signal lines; a DLL (Delayed Locked Loop) circuit 5; and a control logic 6.

The DLL circuit 5 is a circuit that synchronizes with an externally inputted write clock RXCLK, thereby generating a clock "rclk" that controls internal write data, and generating a clock "tclk" that controls internal read data in response to an externally inputted readout clock TXCLK.

In addition, a control logic 6 is a circuit that logically computes a protocol inputted by an external command signal COMMAND, and generates a memory circuit control signal.

The left and right I/O circuits 4 each acquires serial write data DQ <0:7> and DQ <8:15> from an external input/output data line by using an internal write data control clock "rclk", and outputs internal serial write data eWrite and oWrite to be inputted to the left and right shift register section 3 that consists of a plurality of shift registers.

In addition, by using the internal read data control clock "tclk", the internal serial read data eRead and oRead are acquired respectively from the left and right shift register section 3, and serial read data DQ <0:7> and DQ <8:15> are outputted respectively to the external input/output data lines.

The <0:7> and <8:15> used here denotes first-half 8DQ data and latter-half 8DQ data of 16DQ. The characters "e" and "o" assigned to Read and Write denotes even number (even) and odd number (odd) data.

The left and right shift register sections 3 each acquire the internal parallel read data RD <0:7> respectively read out from the memory core section 2 by a control signal during readout operation. Then, these register sections each output the internal parallel write register WD <0:7> respectively by a control signal during write operation, and then, writes it into the memory core section 2.

In this way, the internal parallel read data RD <0:7> is converted into the internal serial read data "eRead" and "oRead" during readout operation between the left and right I/O circuits 4 each and the memory core section 2. In addition, the internal serial write data "eWrite" and "oWrite" are converted into the internal parallel write data WD <0:7> during write operation.

The memory core section 2 is composed of a general DRAM circuit that consists of a row decoder, a column decoder, a memory cell array, a sense amplifier, a redundancy phase, and a DQ buffer.

As described above, in a layout configuration of a conventional high frequency clock synchronous memory, parallel read data read out from the memory core section 2 is converted into serial read data by the shift register 3, and the converted serial read data is delivered to the I/O circuit 4. FIG. 24 shows a path from the conversion to the delivery. Serial numbers 0 to 7 and 8 to 15 are assigned to the left and right I/O circuits 4 incorporated in a peripheral circuit section 7 enclosed by dotted line.

In the case where data is written into the memory core section 2, the serial write data inputted from the I/O circuit 4 is inputted to the shift register section 3. Then, the inputted write data is written into the memory core section 2 after converted into parallel write data at the shift register section 3.

In this way, a data flow in write operation can be obtained by reversing the data flow in readout operation. Thus, FIG. 24 shows a path of read data as an example of readout operation.

In FIG. 24, at the memory core sections 2 disposed at the top and bottom of the peripheral circuit section 7, the 8-bit regions each are assigned to the left memory core section 2, corresponding to each of the left 8-bit I/O circuits 4 having serial numbers 0 to 7 assigned thereto. Similarly, the 8-bit regions each are assigned to the right memory core section 2, corresponding to each of the right 8-bit I/O circuits 4 having serial numbers 8 to 15 assigned thereto. Namely, a 16-bit configured high frequency clock synchronous memory is entirely configured.

In this way, as is evident from the memory core section 2 in FIG. 24, the 8-bit regions (I/O) 0 (0:7) to (I/O) 15 <0:7> each are assigned to a cell array. When the high frequency clock synchronous memory is active, the above four memory core sections 2 are selected according to a combination of the upper left and lower right or a combination of the lower left and upper right by an address signal.

The read data read out in parallel from the memory core section 2 every 8 bits is converted into each items of 8-bit serial read data at the shift register section 3. Configurations of the shift register section are shown in FIGS. 25 and 26, and a disposition of the shift register section 3 relevant to the memory core section 2 and peripheral circuit section 7 is shown in FIG. 27.

As shown in FIGS. 25 and 26, the write register is composed of: an odd number write register that inputs 4-bit odd number serial write data "oWrite", and outputs 4-bit odd number parallel data WD <1, 3, 5, 7> ; and an even number write register that inputs 4-bit even number serial write data "eWrite", and outputs parallel write data WD <0, 2, 4, 6>.

In addition, the read register is composed of: an odd number read register that acquires 4-bit odd number parallel read data RD <1, 3, 5, 7>, and outputs 4-bit odd number parallel read data "oRead" and an even number read register that acquires 4-bit even number parallel read data RD <0, 2, 4, 6>, and outputs 4-bit even number parallel data "eRead".

In more detail, these write register and read register use both edges of the write and readout control clocks "rclk" and "tclk" to transfer 8-bit data at a clock of 4 cycles.

In addition, the shift register section 3 that consists of a write register and a read register is collected into a block in units of bits that corresponds to each of the bits (I/O) 0 to (I/O) 7, and a set of shift register sections are configured in a form in which the blocks in units of 8 bits are stacked in a Y direction.

As shown in a pattern layout of FIG. 27, such two sets of shift register sections 3 corresponds to 8 bits are disposed at the center in the X direction of a chip. That is, two sets of shift register sections 3 that correspond to 16 I/O circuits 4 are disposed at the center in the X direction.

From the I/O circuits 4, eight internal serial write data lines for even number data "eWrite" and eight internal serial write data lines for odd number data "oWrite" are corrected respectively to the corresponding 8 write registers for each bit. Thus, a total of 16 internal serial write data are connected to eight write registers through a peripheral circuit.

In addition, eight internal serial read data lines for even number "eRead" and eight internal serial read data lines for odd number data "oRead" are connected respectively to the corresponding eight read registers for each bit. Thus, a total of 16 internal serial read data lines extend to the peripheral circuit section, and are connected to the I/O circuit 4 through the peripheral circuit section.

When the wire resistance from the corresponding read register for each bit to the peripheral circuit section is defined as Rs, the wire resistance Rs from the bit corresponding register that is the most distant from the peripheral circuit section is obtained to be maximal.

Because of this, in a shift register circuit that gives priority to write operation as shown in FIG. 26, a delay of a propagation time caused by an increase in wire length Rs of the read registers "eRead" and "oRead" is problematic, and there is a possibility that an operational margin cannot be maintained.

An example of read operation will be described by way of timing waveforms shown in FIG. 28. When a read command signal COMMAND is inputted, 8-bit read data RD <0:7> are outputted in parallel from one of the memory core sections 2 after a predetermined time.

The 8-bit parallel read data RD <0:7> synchronizes with a rise of "tclk" that controls internal read data, and is converted into 4-bit serial read data "oRead" that consists of odd numbers 1, 3, 5, and 7.

Similarly, the RD <0:7> synchronizes with a fall of the "tclk" that controls internal read data, and is converted into 4-bit serial read data that consists of odd numbers 0, 2, 4, and 6 at the "even" side of the read register.

By combining them, a total of 8-bit serial read data having numbers 0 to 7 assigned thereto are externally outputted via the I/O circuit 4.

In this way, 8-bit serial read data is outputted at a 4-cycle "tclk". That is, "oRead" and "eRead" of each of four bits can be outputted alternately by using rise and fall edges of "tclk".

The read register of the shift register section in this conventional circuit is shown in FIG. 29.

The RD <0:7> outputted from the memory core section 2 is acquired by a load signal, and the read data RD <0, 2, 4, 6> at the "even" side is transferred through Pipe <n> while the "tclk" is defined as a reference, and "eRead" are sequentially outputted. Similarly, with respect to the read data at the "odd" side as well, the RD <1, 3, 5, 7> pass through Pipe >n> signal, and oRead are sequentially outputted while the "tclk" is defined as a reference.

In such a pipeline system for a read register that gives priority to write operation, a total of 16 internal pipeline read data lines for even number data "eRead" and odd number data "oRead" for transferring read data are required in a Y direction. The read register is composed of a total of 32 wires, thus resulting in an increase in area.

This FF circuit is shown in FIG. 30 to FIG. 32. In FIG. 30, each of the RD <6, 4, 2> at the "even" side and each of the RD <7, 5, 3> at the "odd" side are acquired by the respective outFF circuits one by one signals, and are transferred to the adjacent pipe read data at one cycle of each of the fall and rise of "tclk". FIGS. 31 and 32 each show an FF circuit at the final stage of "eRead" and "oRead", where final adjustment is made, "eRead" is outputted by an outFF1 circuit (FIG. 31) that outputs the data at the "even" side at a fall of "tclk", and "oRead" is outputted by an outFF1 circuit (FIG. 32) that outputs the data at the "odd" side at a fall of "tclk".

Read operation at this time will be described by way of a timing waveform chart shown in FIG. 33. A read command signal COMMAND is inputted, and 4-bit read data RD <0:3> is outputted in parallel to the "even" side from one of the memory core section after a predetermined time.

The 4-bit parallel read data RD <0:3> at the "even" side acquires all data by a load signal, and then, transfers pipe read data to the adjacent outFF circuit by an outFF circuit while the "tclk" is defined as a reference.

In this way, "eRead" data is outputted for each cycle. In an outFF circuit that outputs Pipe 3 after data has been delivered, even after read data of RD <3> has been delivered, the FF circuit continuously operates while "tclk" is defined as a reference, and an unnecessary 3-cycle operation is made. Similarly, in an outFF circuit that outputs Pipe 2 as well or in an outFF circuit that outputs 2-cycle Pipe 1 as well, an unnecessary one-cycle operation is made. Similar operation is made at the "odd" side as well.

Because of this, the FF circuit operates during an operation other than necessary read data transfer, and thus, the corresponding power is excessively applied.

In addition, FF circuits with the "tclk" being defined as a reference are incorporated for each bit one by one, whereby eight FF circuits are incorporated in each I/O. Thus, 128 FF circuits operate at the same time during one read register circuit operation, and more power is excessively applied.

Further, in such a pipeline circuit, read data are sequentially transferred by using Pipe >n> while the "tclk" is defined as a reference. Thus, only data transfer in predetermined sequence can be performed, eliminating the flexibility for data readout.

BRIEF SUMMARY OF THE INVENTION

A semiconductor memory device according to an embodiment of the present invention comprises: a memory cell array including a plurality of memory cells; a first latch circuit group including a plurality of latch circuits, the first latch circuit group latching n/2 of n-bit read data outputted from the memory cell array, and sequentially outputting the latched n/2 bit read data in response to sequentially shifted read control signals ("n" denotes a natural number); a first output circuit, the first output circuit sequentially outputting the n/2 bit read data sequentially outputted from the first latch circuit group as n/2 bit serial read data in synchronism with a clock signal; a second latch circuit group including a plurality of latch circuits, the second latch circuit group latching the remaining n/2 of n-bit read data outputted from the memory cell array, and sequentially outputting the remaining latched n/2 bit read data in response to the sequentially shifted read control signal; and a second output circuit, the second output circuit sequentially outputting the remaining n/2 bit read data sequentially outputted from the second latch circuit group as the remaining n/2 bit serial read data in synchronism with the clock signal.

BRIEF DESCRIPTION OF THE SEVERAL VIEWS OF THE DRAWING

FIG. 1 is a block diagram showing one example of a circuit configuration of a high frequency clock synchronous memory to which the an embodiment of the present invention is applied.

FIG. 18 is a circuit diagram showing one example of an FF circuit shown in FIGS. 4, 6, 8, 10, and 12.

FIG. 19 is a circuit diagram showing one example of a Lat2 circuit shown in FIG. 6.

FIG. 20 is a circuit diagram showing one example of an FF1 circuit shown in FIG. 6.

DETAILED DESCRIPTION OF THE INVENTION

Figure 2:
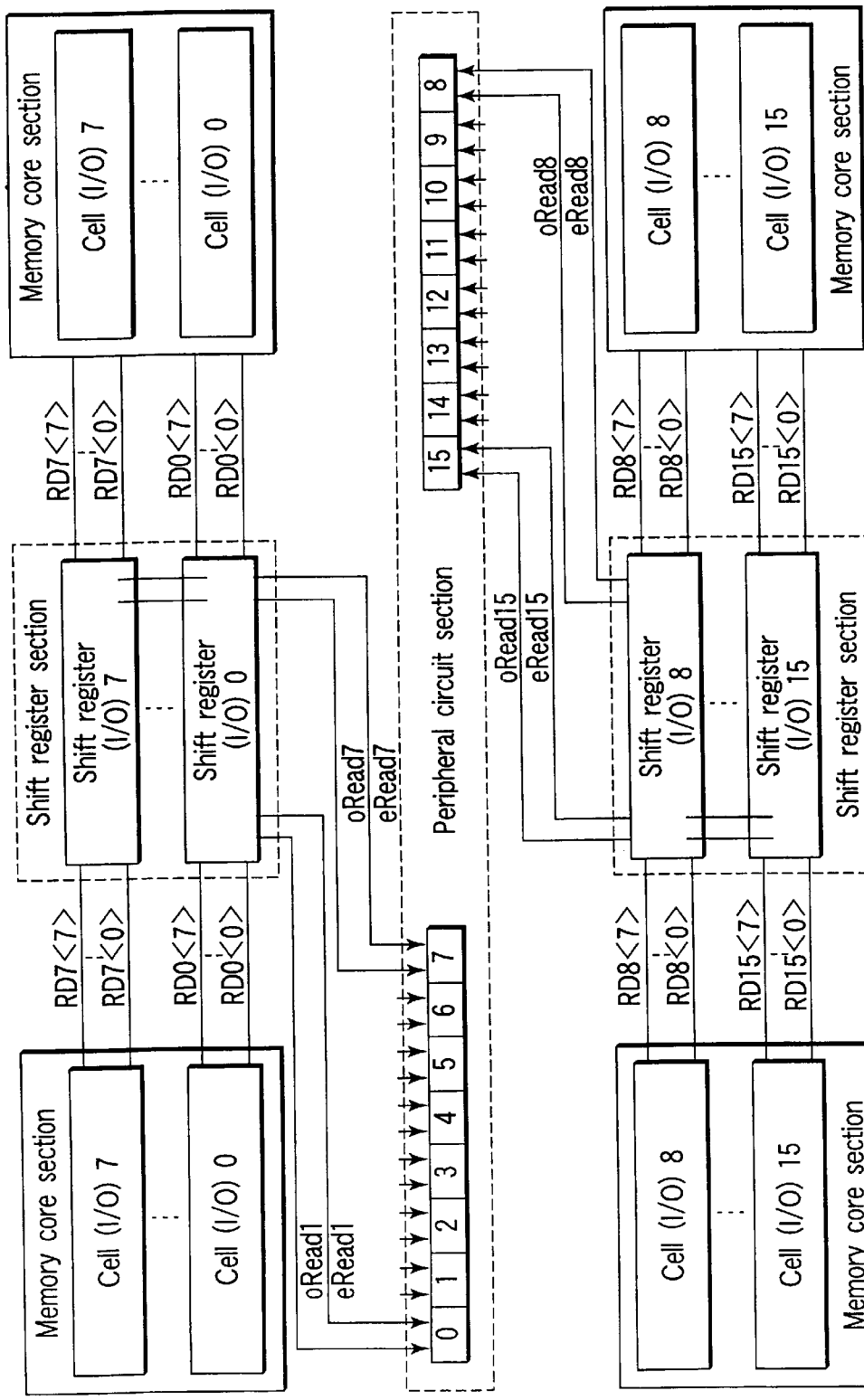
FIG. 2 is a view showing one example of a path of read data for the high frequency clock synchronous memory shown in FIG. 1.

The present invention is directed to a read register circuit that carries out parallel-serial conversion consisting of part of a shift register, wherein a pipeline system is abandoned, and a non-pipeline system for directly outputting parallel read data in a predetermined sequence is employed. By this technique, a circuit can be simplified, a chip area can be reduced, and power can be reduced.

Hereinafter, preferred embodiments of the present invention will be described with reference to the accompanying drawings. In the following description, like elements common to all the figures are designated by like reference numerals.

First Embodiment

FIG. 1 is a block diagram showing one example of a circuit configuration of a high frequency clock synchronous memory to which the an embodiment of the present invention is applied.

As shown in FIG. 1, a memory circuit 1 is comprised of a memory core section 2 and the other I/F circuit.

The I/F circuit comprises: left and right shift register sections 3 adjacent to the memory core section 2; left and right I/O circuits (input/output circuits) 4 disposed between the corresponding external signal lines; a DLL (Delayed Locked Loop) circuit 5; and a control logic 6.

The DLL circuit 5 is a circuit that synchronizes with an externally inputted write clock RXCLK, thereby generating a clock "rclk" that controls internal write data, and generating a clock "tclk" that generates internal read data to an externally inputted readout clock TXCLK.

In addition, the control logic 6 is a circuit that logically computes a protocol inputted by an external command signal COMMAND, thereby generating a control signal of a memory circuit.

The left and right I/O circuits 4 each use an internal write data control clock "rclk", thereby acquiring serial write data DQ <0:7> and DQ <8:15>, respectively, from an external input/output data line, and outputting internal serial write data "eWrite" and "oWrite" inputted to the left and right shift register section 3 that consists of a plurality of shift registers.

In addition, internal serial read data "eRead" and "oRead" are acquired, respectively, from the left and right shift register sections 3 by using the internal read data control clock "tclk", and serial read data DQ <0:7> and DQ <8:15> are outputted, respectively, to the external input/output data line.

Here, the <0:7> and <8:15> indicates first-half 8DQ data and latter-half 8DQ data of 16DQ. The characters "e" and "o" assigned to Read and Write indicate an even number (even) and an odd number (odd), respectively.

The left and right shift register sections 3 each acquire the internal parallel read data RD <0:7> read out from the memory core section 2 by a control signal during read operation. Then, the shift register sections each output the internal parallel write register WD <0:7> by a control signal during write operation, and write the outputted register WD into the memory core section 2.

In this way, the left and right register sections 3 each convert the internal parallel read data RD <0:7> between the left and right I/O circuits 4 each and the memory core section 2 during readout operation. Then, the register sections 3 each convert the internal serial write data "eWrite" and "oWrite" into the internal parallel write data WD <0:7> during write operation.

The memory core section 2 is composed of a general DRAM circuit that consists of row data, column data, a memory cell array, a sense amplifier, a redundancy phase, and a DQ buffer.

In the layout configuration of the above high frequency clock synchronous memory, the parallel read data read out from the memory core section 2 is converted into serial read data by the shift register 2, and the converted serial read data is delivered to the I/O circuit 4. FIG. 2 shows a path from the conversion to the delivery. Here, serial numbers 0 to 7 and 8 to 15 are assigned to the left and right I/O circuits 4 incorporated in the peripheral circuit section 7 enclosed by dotted line.

In the case where data is written into the memory core section 2, the serial write data inputted from the I/O circuit 4 is inputted to the shift register section 3 Then, the inputted write data is written into the memory core section 2 after converted into parallel write data at the shift register section 3.

In this way, a data flow in write operation can be obtained by reversing the data flow in readout operation. Thus, FIG. 2 shows one example of a path of read data as an example of readout operation.

In FIG. 2, at the memory core sections 2 disposed at the top and bottom of the peripheral circuit section 7, the 8-bit regions each are assigned to the left memory core section 2, corresponding to each of the left 8-bit I/O circuits 4 having serial numbers 0 to 7 assigned thereto. Similarly, the 8-bit regions each are assigned to the right memory core section 2, corresponding to each of the right 8-bit I/O circuits 4 having serial numbers 8 to 15 assigned thereto. Namely, a 16-bit configured high frequency clock synchronous memory is entirely configured.

Figure 24:
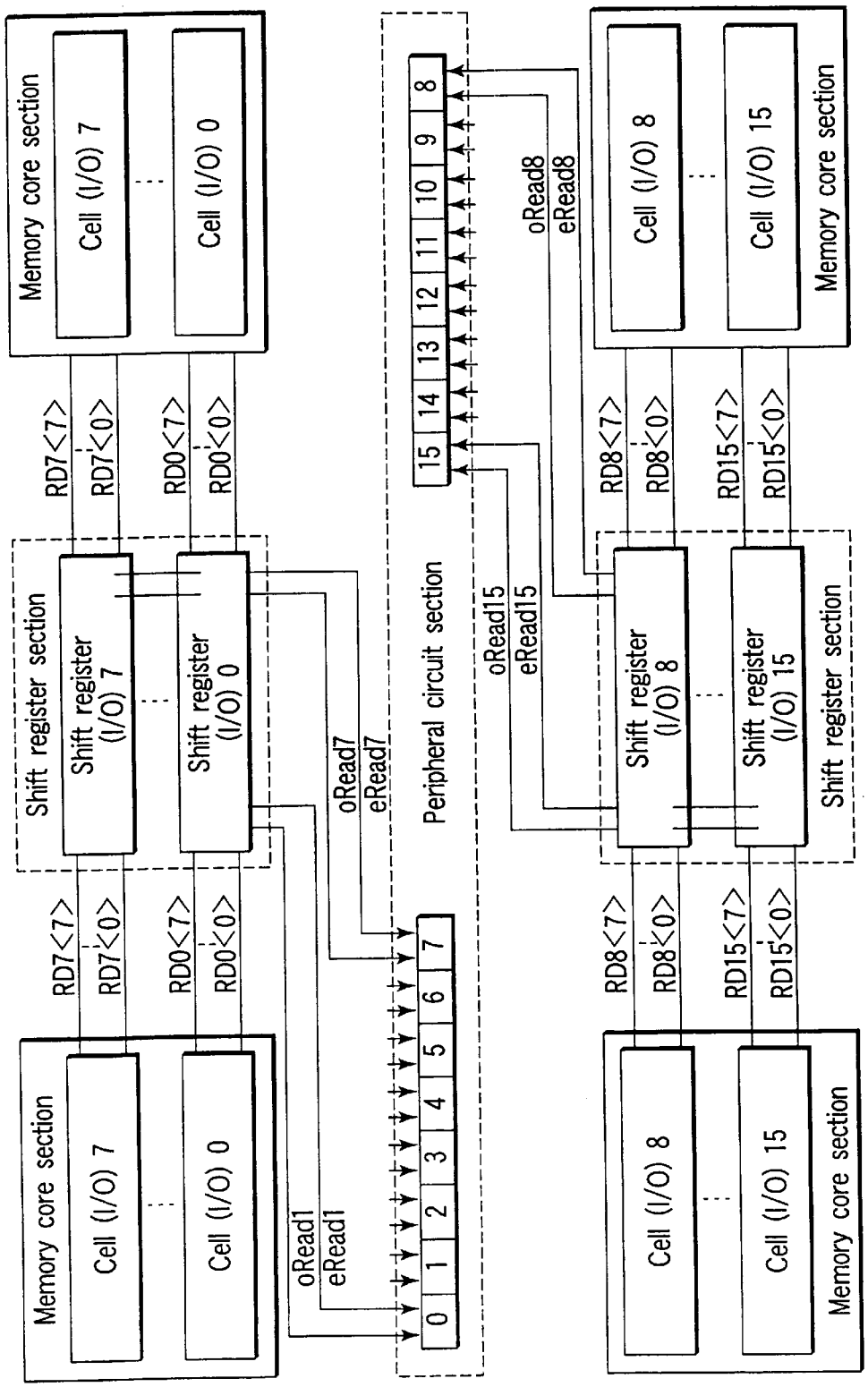
FIG. 24 is a view showing a path of read data of the high frequency clock synchronous memory shown in FIG. 23.
Figure 25:
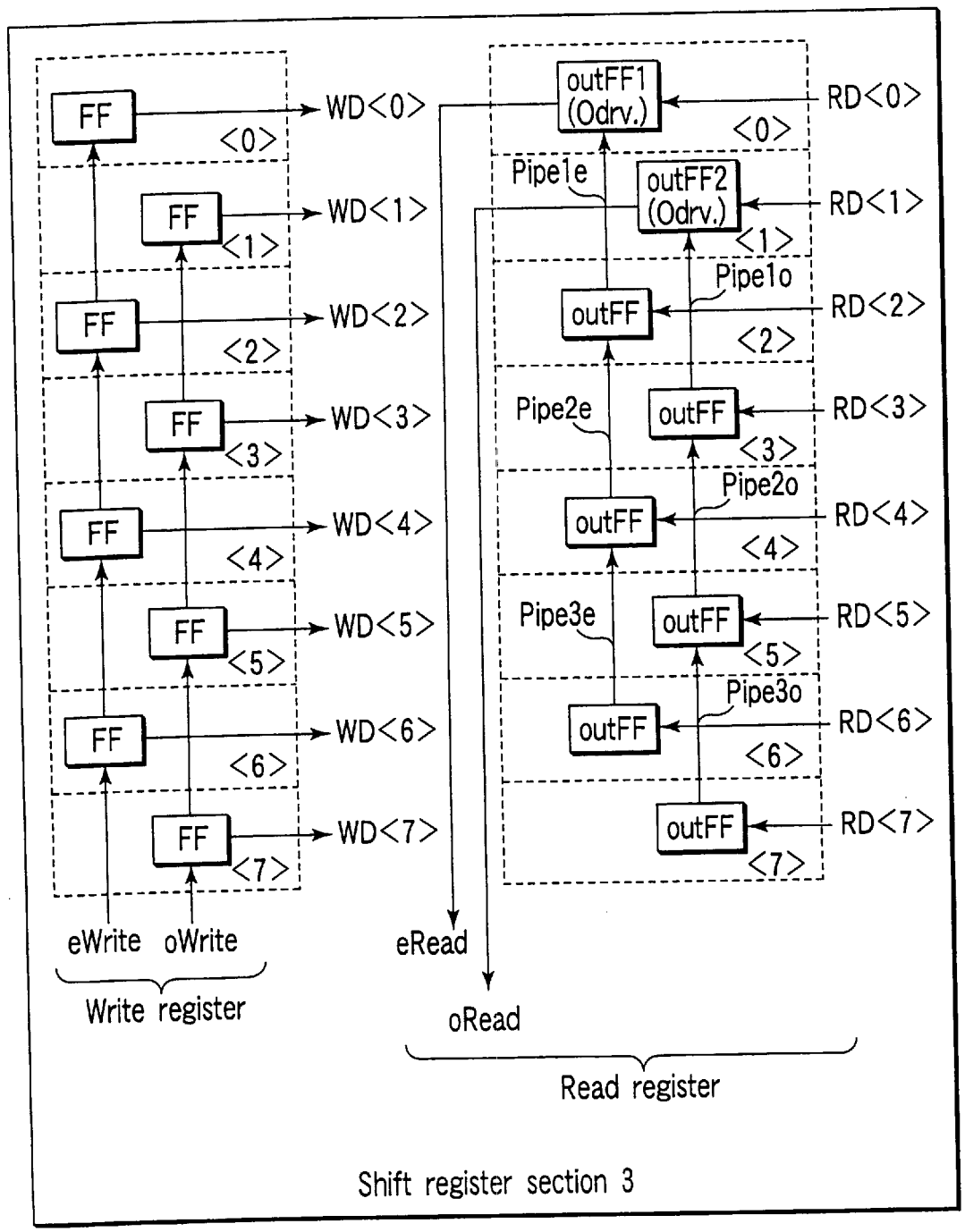
FIG. 25 is a view showing a configuration of the shift register of the high frequency clock synchronous memory shown in FIG. 23.

In this way, as is evident from the memory core section 2 in FIG. 24, the 8-bit regions (I/O) 0 (0:7) to (I/O) 15 <0:7> each are assigned to a cell array. When the high frequency clock synchronous memory is active, the above four memory core sections 2 are selected according to a combination of the upper left and lower right or a combination of the lower left and upper right by an address signal.

The read data read out in parallel from the memory core section 2 every 8 bits is converted into each item of 8-bit serial read data at the shift register section 3. Configurations of the shift register section are shown in FIGS. 3 and 21, and a disposition of the shift register section 3 relevant to the memory core section 2 and peripheral circuit section 7 is shown in FIG. 22.

Figure 3:
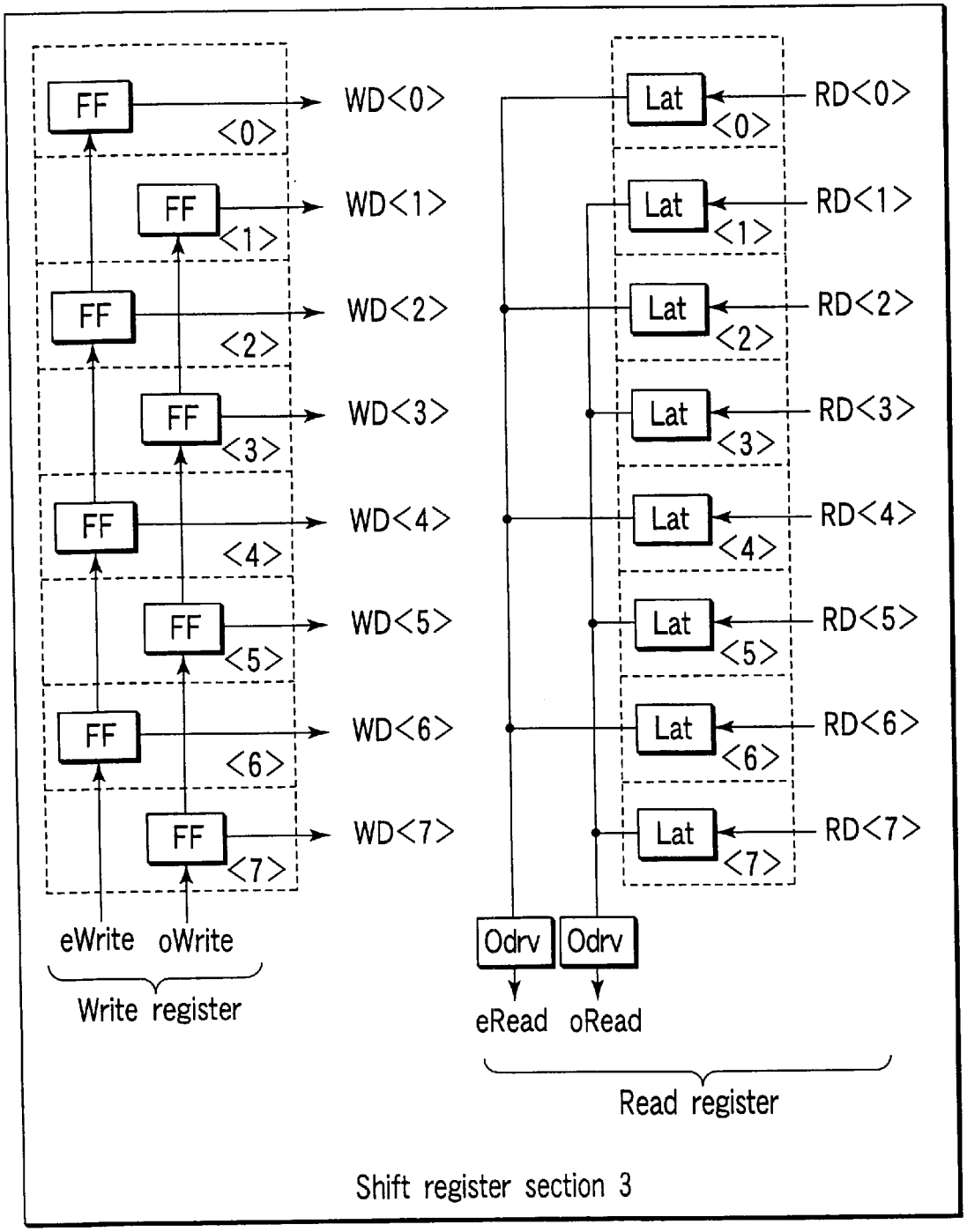
FIG. 3 is a view showing a configuration of a shift register of the high frequency clock synchronous memory shown in FIG. 1.
Figure 21:
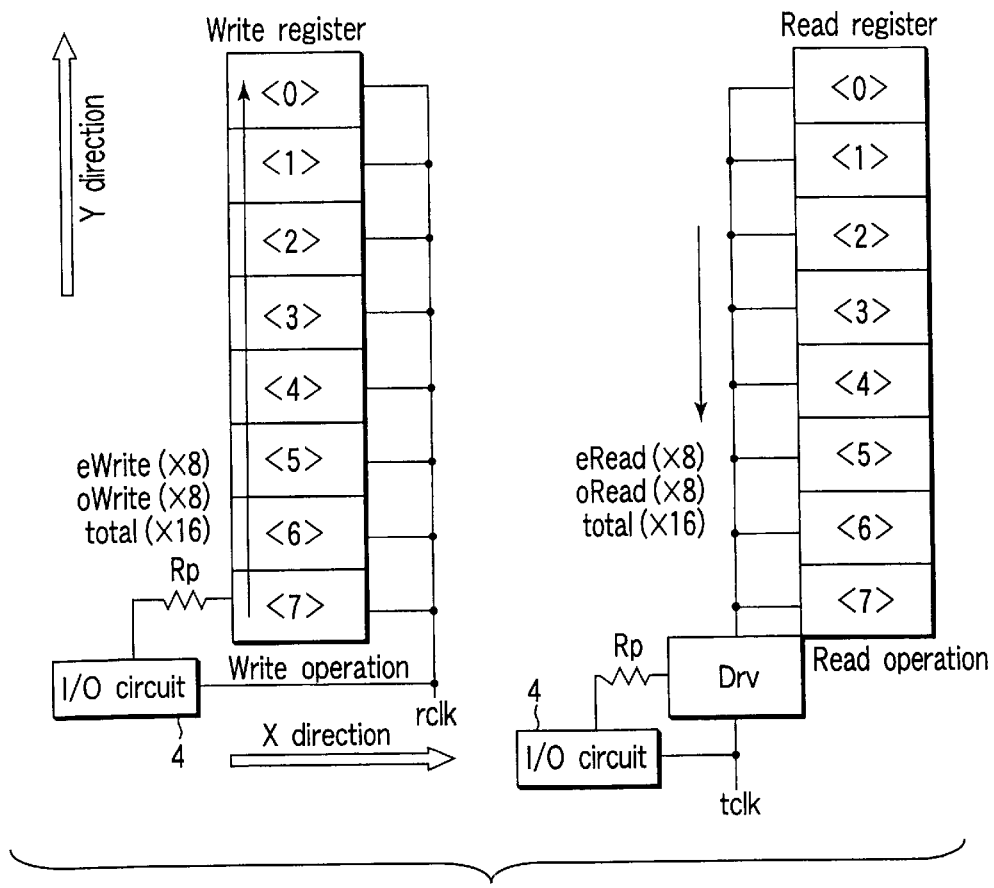
FIG. 21 is a block diagram showing one example of a configuration of the shift register of a high frequency clock synchronous memory shown in FIG. 1.
Figure 22:
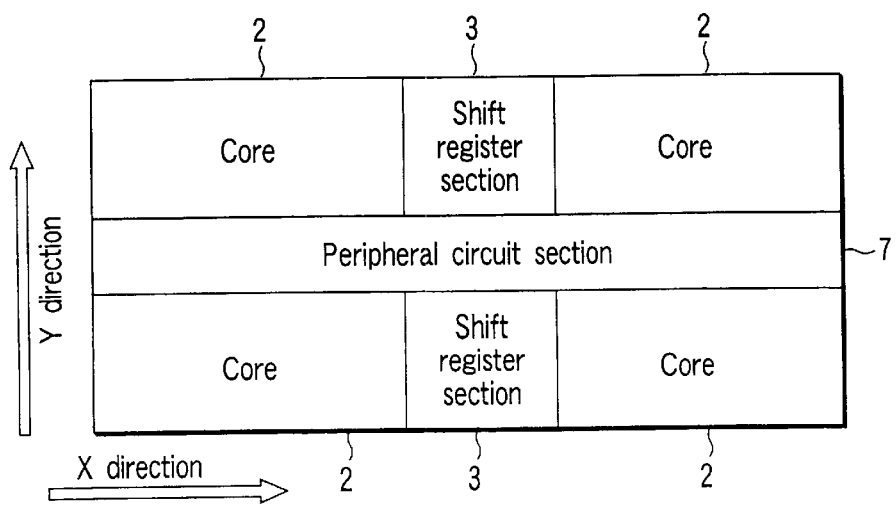
FIG. 22 is a layout view showing one example of a circuit layout of the high frequency clock synchronous memory shown in FIG. 1.
Figure 23:
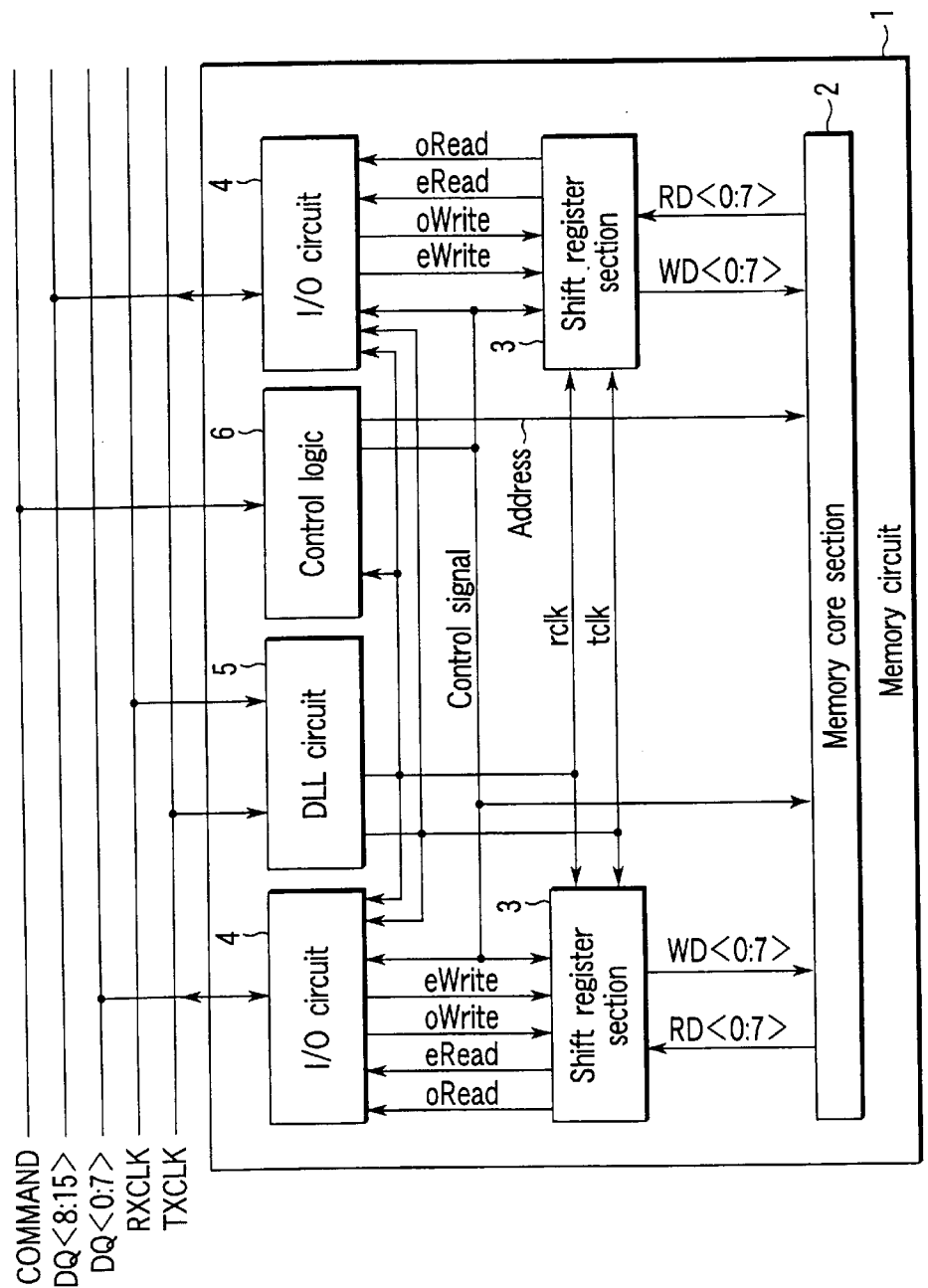
FIG. 23 is a block diagram showing a circuit configuration of a general high frequency clock synchronous memory.

As shown in FIGS. 3 and 21, the write register is composed of: an odd number write register that inputs 4-bit odd number serial write data "oWrite", and outputs 4-bit odd number parallel write data WD <1, 3, 5, 7> ; and an even number write register that inputs 4-bit even number serial write data "eWrite", and outputs parallel write data WD <0, 2, 4, 6>.

In addition, the read register comprises: an odd number read register that acquires 4-bit odd number parallel read data RD <1, 3, 5, 7>, and outputs 4-bit odd number parallel read data "oRead"; and an even number read register that acquires 4-bit even number parallel read data RD <0, 2, 4, 6>, and outputs 4-bit even number parallel data "eRead".

In detail, these write register and read register use both edges of the write and readout control clocks "rclk" and "tclk" to transfer 8-bit data at a clock of 4 cycles.

In addition, the shift register section 3 that consists of a write register and a read register is collected into a block in units of bits that corresponds to each of the bits (I/O) 0 to (I/O) 7, and a set of shift register sections are configured in a form in which the blocks in units of 8 bits are stacked in a Y direction.

As shown in a pattern layout of FIG. 22, such two sets of shift register sections 3 corresponds to 8 bits are disposed at the center in the X direction of a chip. That is, two sets of shift register sections 3 that correspond to 16 I/O circuits 4 are disposed at the center in the X direction.

From the I/O circuits 4, eight internal serial write data lines for even number data "eWrite" and eight internal serial write data lines for odd number data "oWrite" are corrected respectively to the corresponding 8 write registers for each bit. Thus, a total of 16 internal serial write data are connected to eight write registers through a peripheral circuit.

In addition, eight internal serial read data lines for even number "eRead" and eight internal serial read data lines for odd number data "oRead" are connected respectively to the corresponding eight read registers for each bit. Thus, a total of 16 internal serial read data lines extend to the peripheral circuit section, and are connected to the I/O circuit 4 through the peripheral circuit section.

Figure 4:
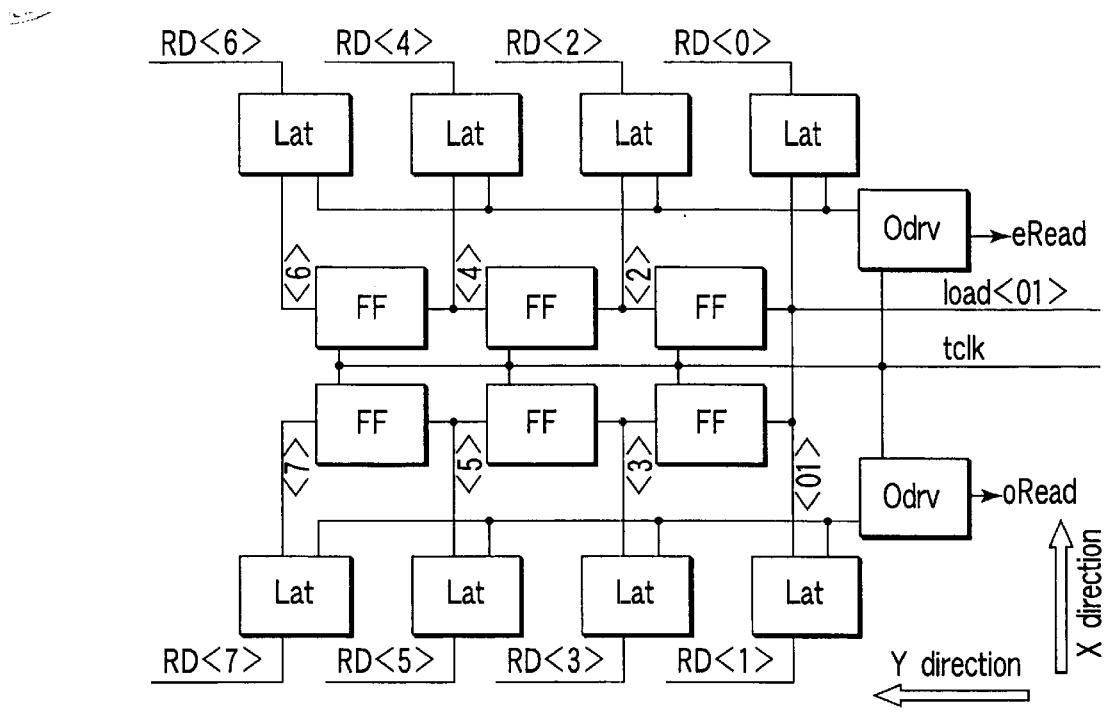
FIG. 4 is a circuit diagram showing one example of a shift register provided in the high frequency clock synchronous memory according to a first embodiment of the present invention.

FIG. 4 is a circuit diagram showing one example of a shift register provided in the high frequency clock synchronous memory according to a first embodiment of the present invention.

In the present embodiment, in order to solve the above described problem, a read register pipeline system is abandoned, and, as shown in FIGS. 3 and 4, four Lat circuits are disposed to receive read data RD <0, 2, 4, 6> at the "even" side, and four Lat circuits are disposed to receive read data RD <0, 2, 5, 7> at the "odd" side. These circuits each are provided such that the read data outputted from the Lat circuits at the "even" side and "odd" side are received by the respective Odrv (out driver) circuits, and "eRead" and "oRead" are sequentially outputted.

By employing these circuits each, only a total of 38 FF circuits (2×16+6) can be configured as compared with 128 FF circuits of the read register conventionally used, and the number of elements can be reduced.

This can be achieved by abandoning the pipeline system and by directly acquiring the read data RD <0:7> outputted from the memory core section by four signals of Load >n>.

Figure 14:
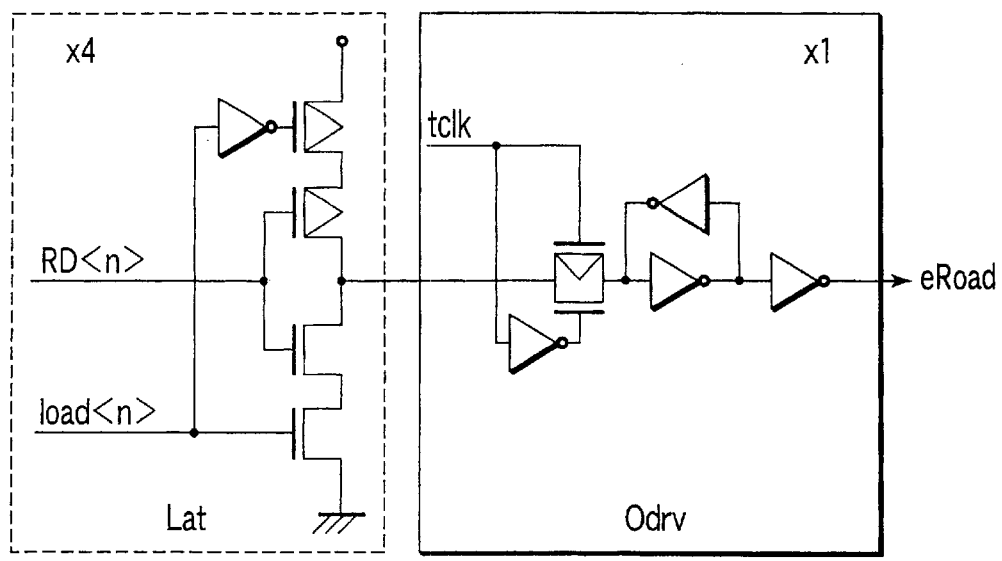
FIG. 14 is a circuit diagram showing one example of a Lat circuit and an Odrv circuit shown in FIGS. 4, 6, 8, and 10.

FIG. 14 shows one example of the Lat circuit and Odrv circuit.

As shown in FIG. 14, items of read data RD <0:7> are inputted to eight Lat circuits, and the Odrv circuits each are disposed at the "even" and "odd" sides each corresponding to each I/O. As compared with a conventional FF circuit, read data is acquired by a Load >n> signal, 4 bits at the "even" side and four bits at the "odd" side are directly inputted to the Odrv circuit, and the "eRead" and "oRead" signals are transferred to the I/O circuit 4.

Figure 5:
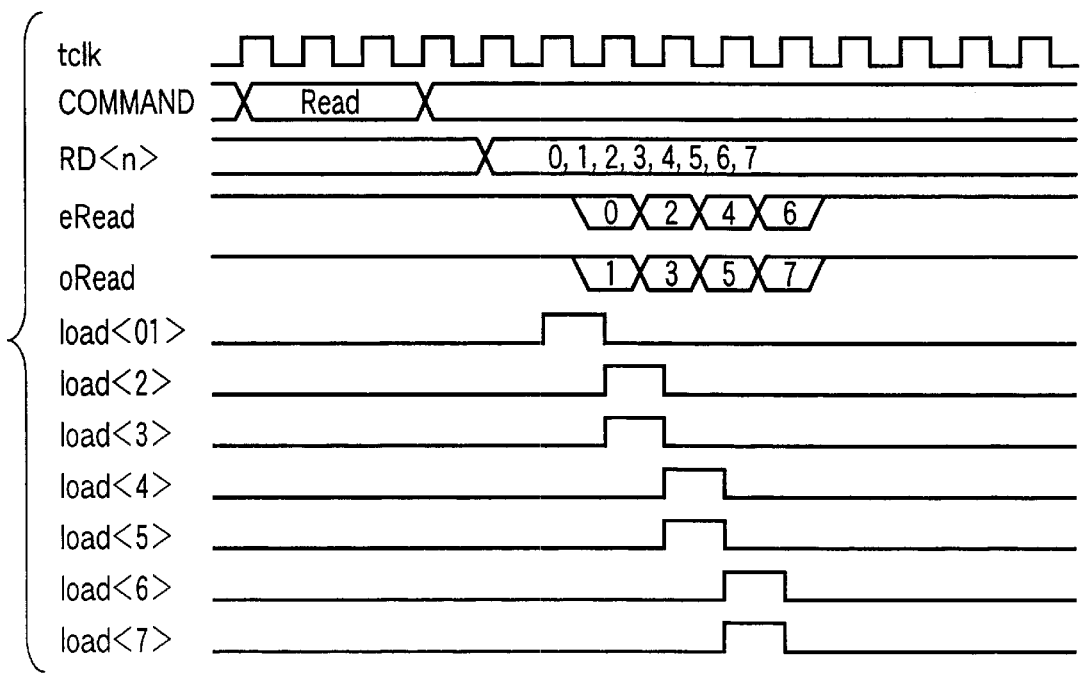
FIG. 5 is a timing waveform chart showing one example of a read operation of the read register shown in FIG. 4.

The Load >n> signals are inputted to three FF circuits connected in series at the "even" side and "odd" side each. An exemplary circuit of the FF circuit is shown in FIG. 18. FIG. 5 is a timing waveform chart showing one example of a read operation of the read register shown in FIG. 4.

As shown in FIG. 5, the read command signal COMMAND is inputted, and 8-bit read data RD <0:7> are outputted in parallel from one of the memory core sections after a predetermined time.

The 8-bit parallel read data RD <0:7> synchronizes with a rise of each of Load <01> and Load <2> to Load <7> that control internal read data, acquires the read data at the "even" side and at the "odd" side, and directly delivers the data to an Odrv circuit.

RD <0> and RD <1> are transferred at a rise of Load <01>; RD <2> is transferred at a rise of Load <2>; RD <3> is transferred at a rise of Load <3>; RD <4> is transferred at a rise of Load <4>; RD <5> is transferred at a rise of Load <4>; RD <6> is transferred at a rise of Load <6>; and RD <7> is transferred at a rise of Load <7>.

At this Load >n>, as shown in FIG. 4, one pulse is transferred for each cycle by an FF circuit from Load <01> to Load <6> when "tclk" is defined as a reference.

According to the first embodiment of the present invention, the number of FF circuits operating when "tclk" is defined as a reference is reduced, whereby the number of elements can be reduced, and power can be reduced.

In addition, as shown in FIG. 22, the read data directly outputted from a read register is transferred to an Odrv circuit, thus making it possible to eliminate conventional pipeline wires, whereby 32 wires running in the read register can be reduced to 16 wires.

Figure 26:
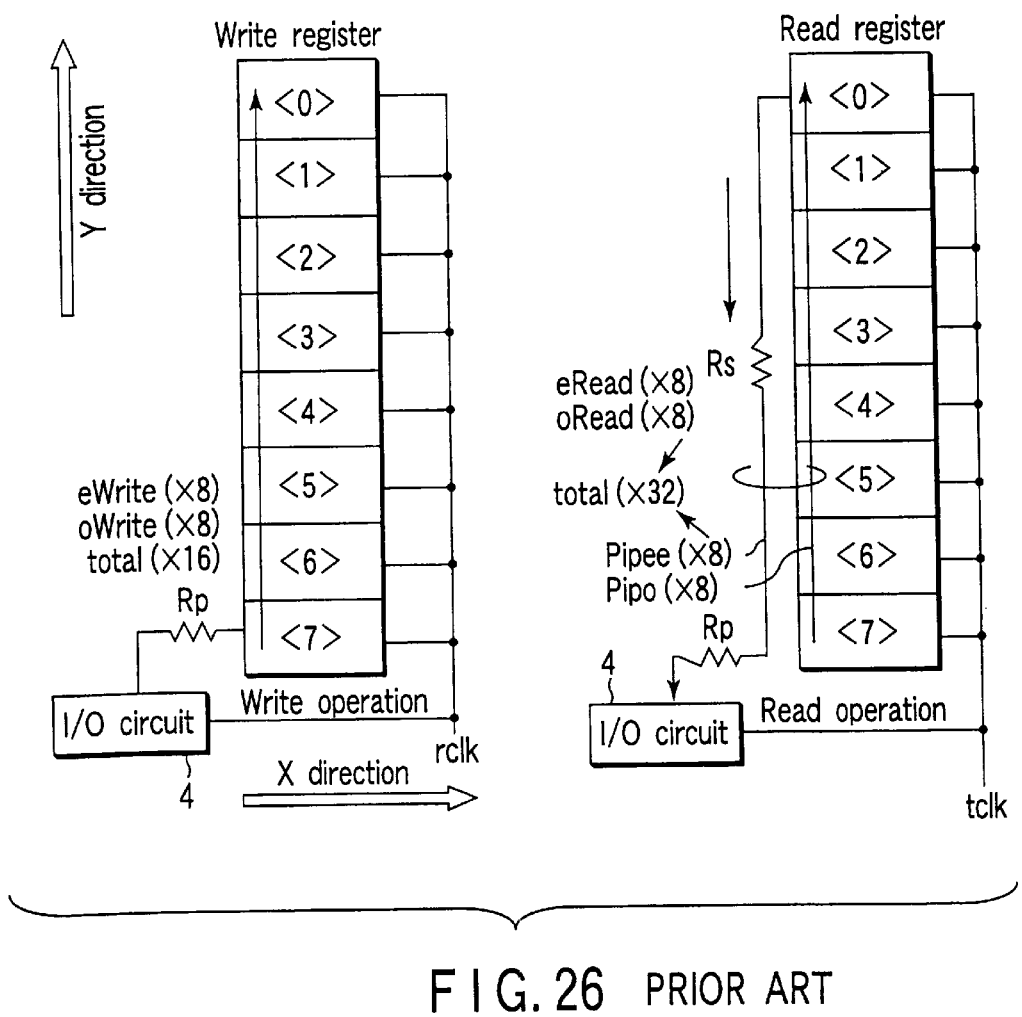
FIG. 26 is a view showing a configuration of the shift register of the high frequency clock synchronous memory shown in FIG. 23.
Figure 27:
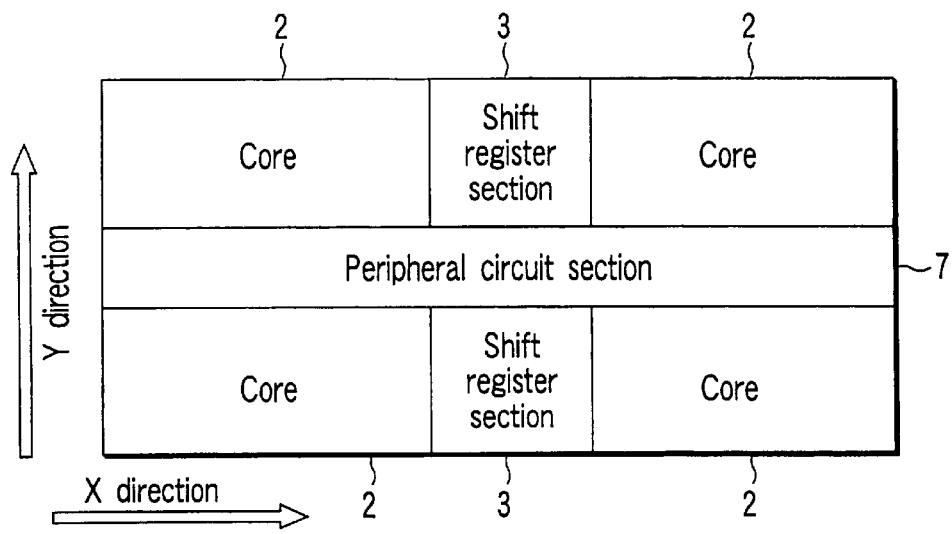
FIG. 27 is a layout view showing a circuit layout of the high frequency clock synchronous memory shown in FIG. 23.
Figure 28:
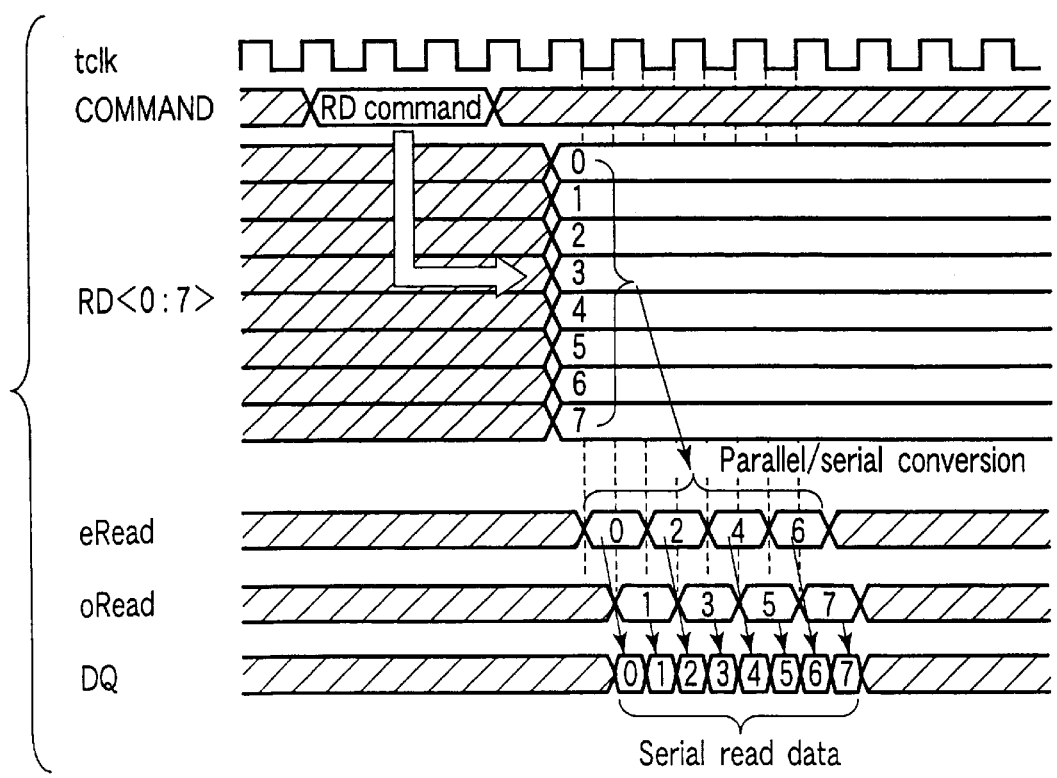
FIG. 28 is a timing waveform chart showing a read operation of the high frequency clock synchronous memory shown in FIG. 23.
Figure 29:
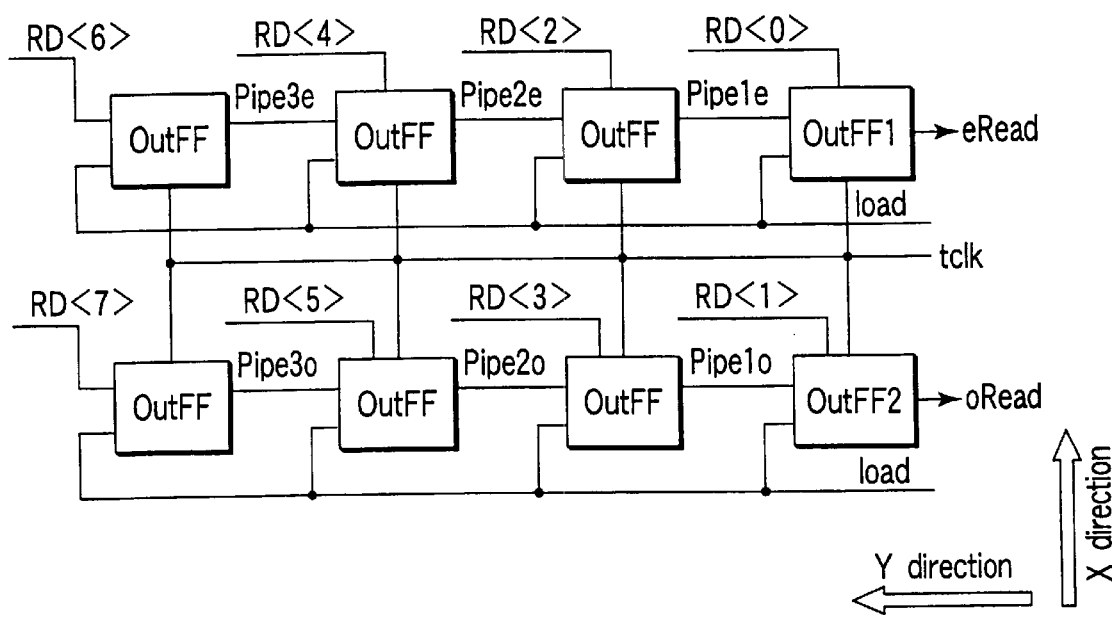
FIG. 29 is a circuit diagram showing a conventional read register.
Figure 30:
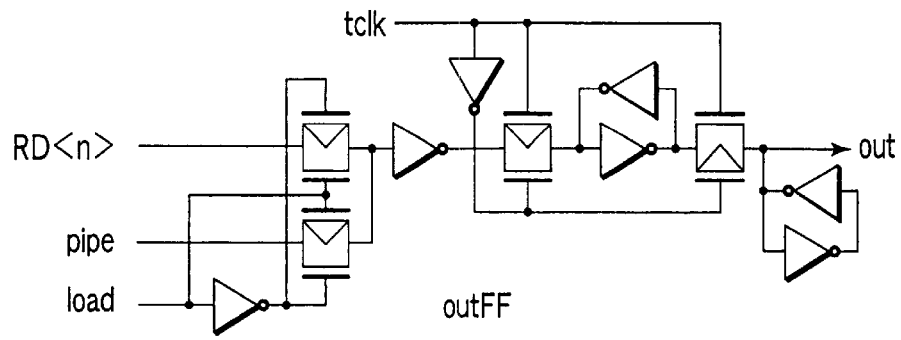
FIG. 30 is a circuit diagram showing an outFF circuit shown in FIG. 29.
Figure 31:
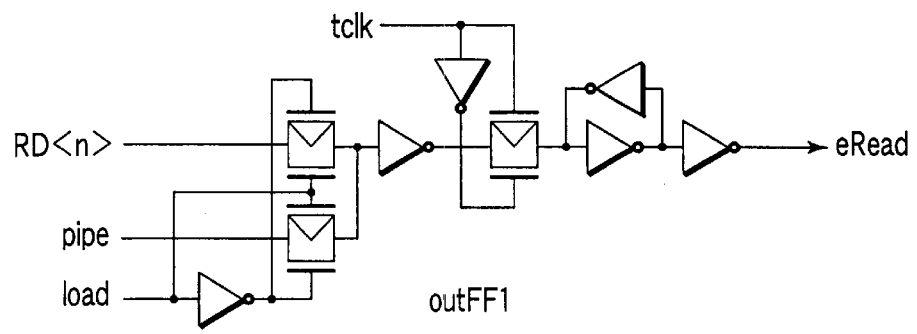
FIG. 31 is a circuit diagram showing an outFF1 circuit shown in FIG. 29.
Figure 32:
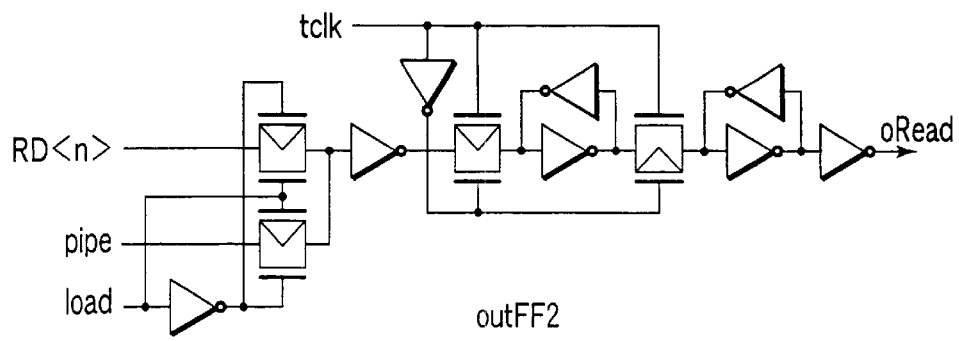
FIG. 32 is a circuit diagram showing an outFF2 circuit shown in FIG. 29.
Figure 33:
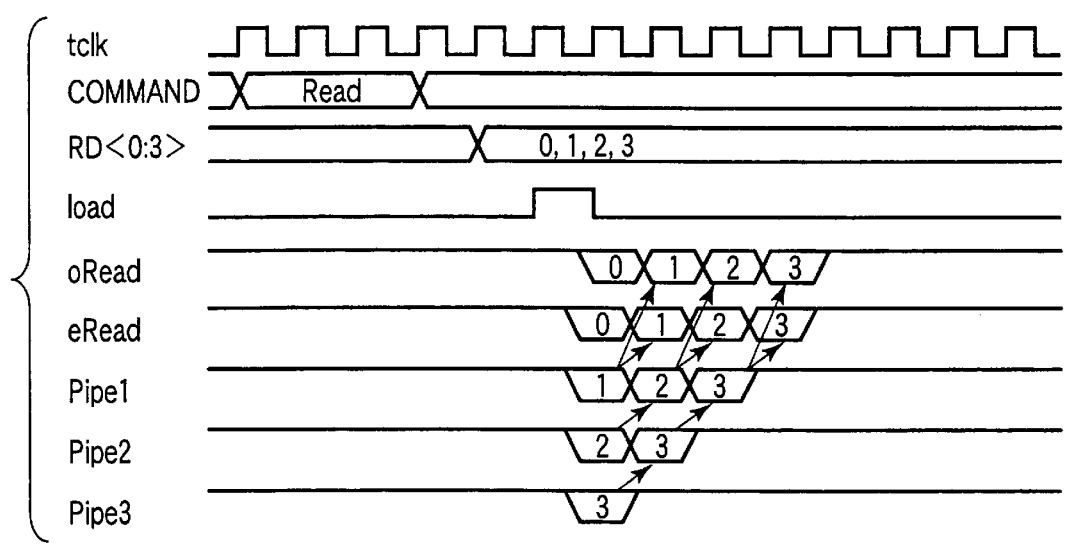
FIG. 33 is a timing waveform chart showing a read operation of the read register shown in FIG. 29.

In addition, in the Description of the Related Art section, a circumstance in which there occurs a propagation delay caused by a wiring resistance Rs described by referring to FIG. 26 can be eliminated by inputting read data to an Odrv circuit disposed in place that is the closest to the peripheral circuit section.

Second Embodiment

Figure 6:
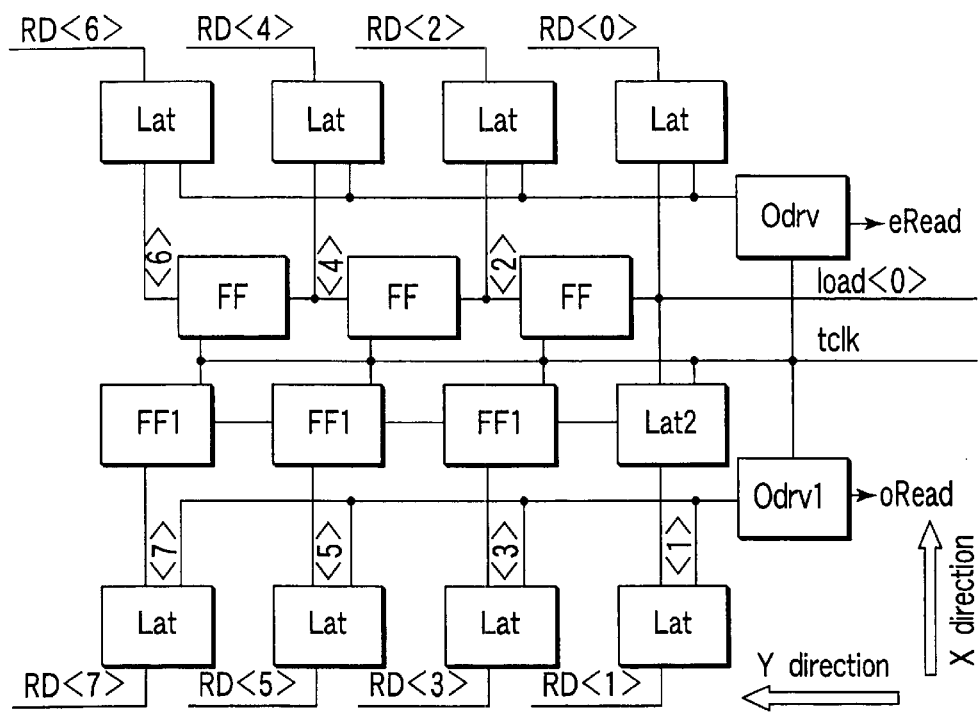
FIG. 6 is a circuit diagram showing one example of a read register provided in a high frequency clock synchronous memory according to a second embodiment of the present invention.

FIG. 6 is a circuit diagram showing one example of a read register provided in a high frequency clock synchronous memory according to a second embodiment of the present invention.

As shown in FIG. 6, according to the second embodiment, the "odd" side of the FF circuits operating at the "even" and "odd" sides shown in the first embodiment is operated as compared with the "even" side by a ½ cycle.

Figure 7:
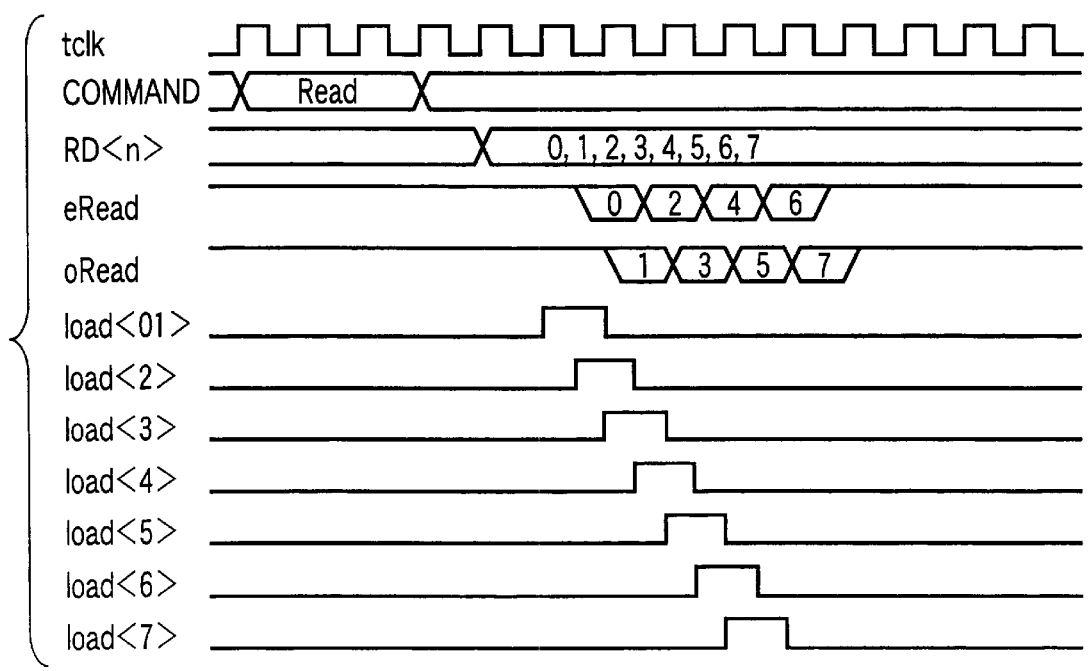
FIG. 7 is a timing waveform chart showing one example of a read operation of the read register shown in FIG. 6.

FIG. 7 is a timing waveform chart showing one example of a read operation of the read register shown in FIG. 6.

As shown in FIG. 7, a Load <0> signal delivered from a control logic at the "odd" side is received by a Lat2 circuit, a waveform is produced by a ½ cycle, and RD <1> is acquired. FIG. 19 shows an exemplary circuit of the Lat2 circuit. The Lat <1> signal is transferred for each cycle by using an FF1 circuit, and RD <1, 3, 5, 7> is acquired. This FF1 circuit is a circuit produced when "tclk" is defined as a reference in the same way as the FF circuit. This circuit acquires data at a rise, and outputs data at a fall. FIG. 20 shows an exemplary circuit of the FF1 circuit.

Figure 15:
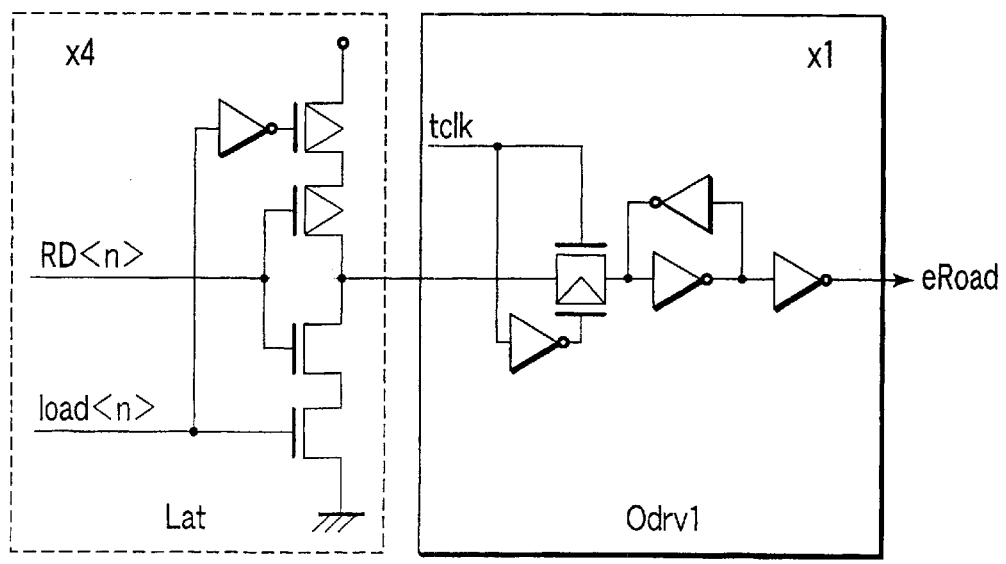
FIG. 15 is a circuit diagram showing one example of a Lat circuit and an Odriv1 circuit shown in FIG. 6.

In addition, an Odrv1 circuit as well is a circuit that transfer data at a rise as shown in FIG. 15.

In this manner, there is no need to adjust an output timing in an I/O circuit 4, and the I/O circuit 4 can be simplified.

Third Embodiment

Figure 8:
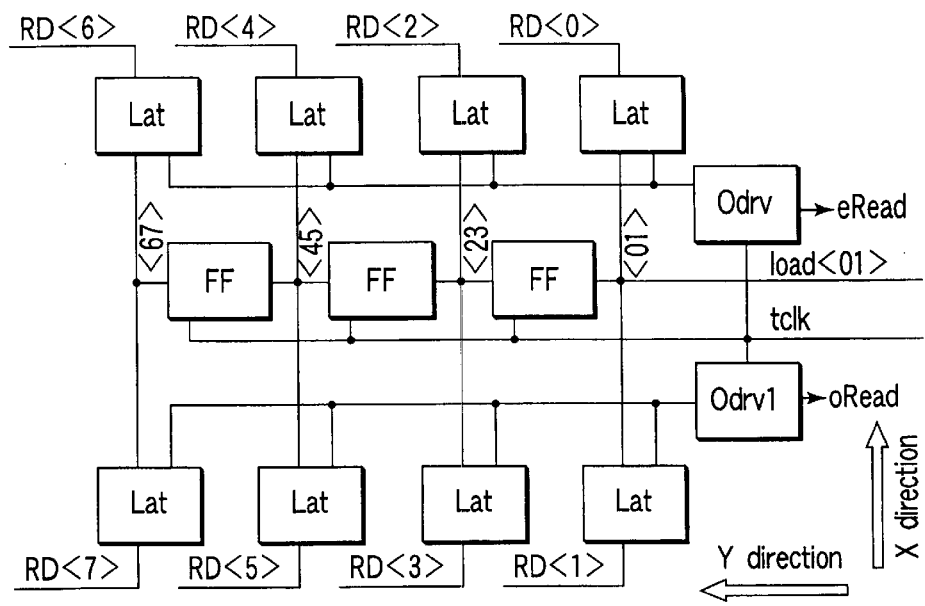
FIG. 8 is a circuit diagram showing one example of a read register provided in a high frequency clock synchronous memory according to a third embodiment of the present invention.

FIG. 8 is a circuit diagram showing one example of a read register provided in a high frequency clock synchronous memory according to a third embodiment of the present invention.

In the first and second embodiments, Load >n> that controls acquisition of read data RD <0:7> is independent at the "even" side and at the "odd" side.

In contrast, in the third embodiment, as shown in FIG. 8, the "even" side and "odd" side of the FF circuit are combined with each other, whereby Load <01> delivered from a control logic is transferred by an FF circuit when "tclk" is defined as a reference, RD <0> and RD <1> are acquired by Load <01>, RD <2> and RD <3> are acquired by Load <23>, RD <4> and RD <5> are acquired by Load <45>, and RD <6> and RD <7> are acquired by Load <67>.

Figure 9:
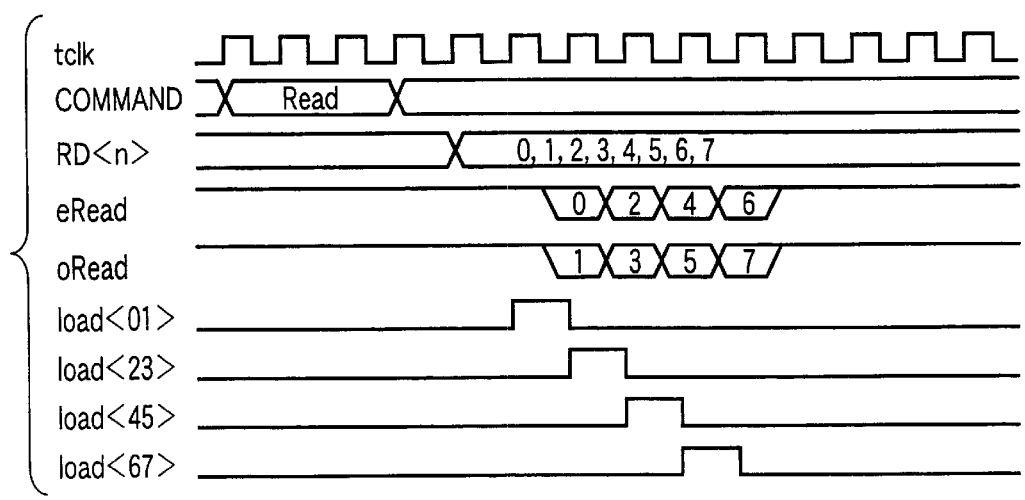
FIG. 9 is a timing waveform chart showing one example of a read operation of the read register shown in FIG. 8.

According to the third embodiment as described above, as compared with the first and second embodiment, three FF circuits can be further reduced. FIG. 9 is a timing waveform chart showing one example of a read operation of the read register shown in FIG. 8.

Fourth Embodiment

Figure 10:
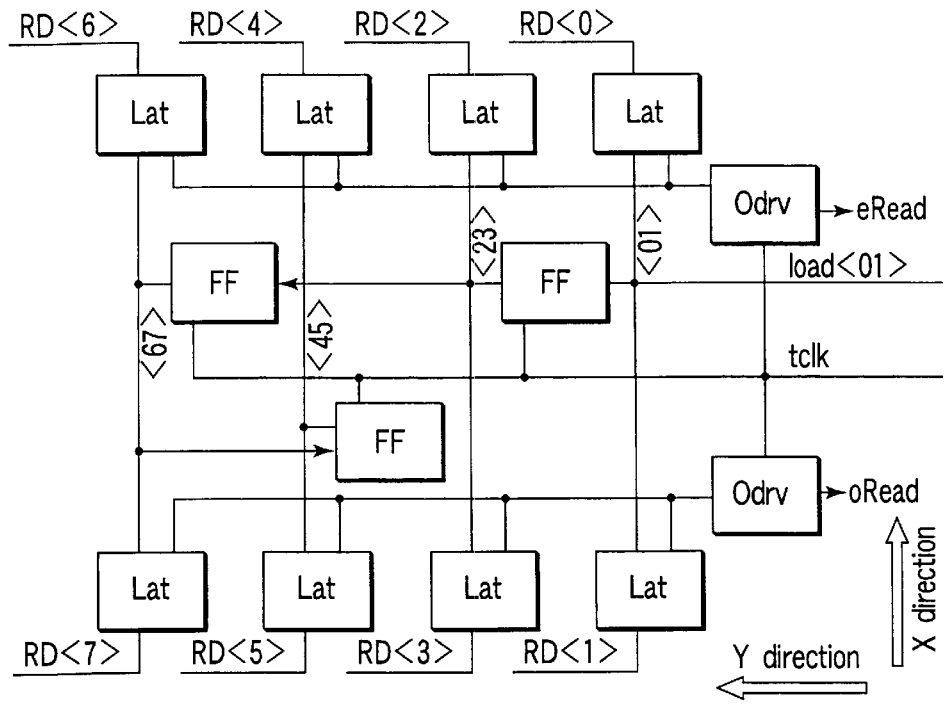
FIG. 10 is a circuit diagram showing one example of a read register provided in a high frequency clock synchronous memory according to a fourth embodiment of the present invention.

FIG. 10 is a circuit diagram showing one example of a read register provided in a high frequency clock synchronous memory according to a fourth embodiment of the present invention.

Figure 11:
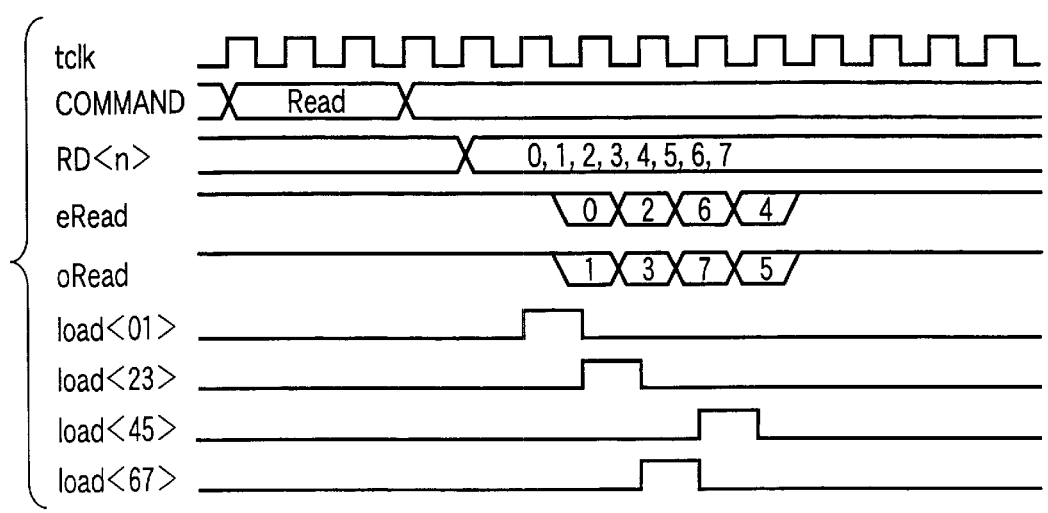
FIG. 11 is a timing waveform chart showing one example of a read operation of the read register shown in FIG. 10.

As shown in FIG. 10, by Load >n> that controls internal read data, a control signal always passing through a unidirectional FF circuit is not only produced, but also the read data acquisition sequence can be changed according to a wiring pattern. FIG. 11 is a timing waveform chart showing one example of a read operation of the read register shown in FIG. 10.

In this way, in the read register according to the present invention, unlike a conventional read register in a pipeline system, the transfer sequence of Load >n> can be changed to Load <01>→ Load <23>→ Load <67>→ Load <45>, and the read data transfer sequence can be freely changed. With such a circuit configuration, the flexibility for data can be increased.

Fifth Embodiment

Figure 12:
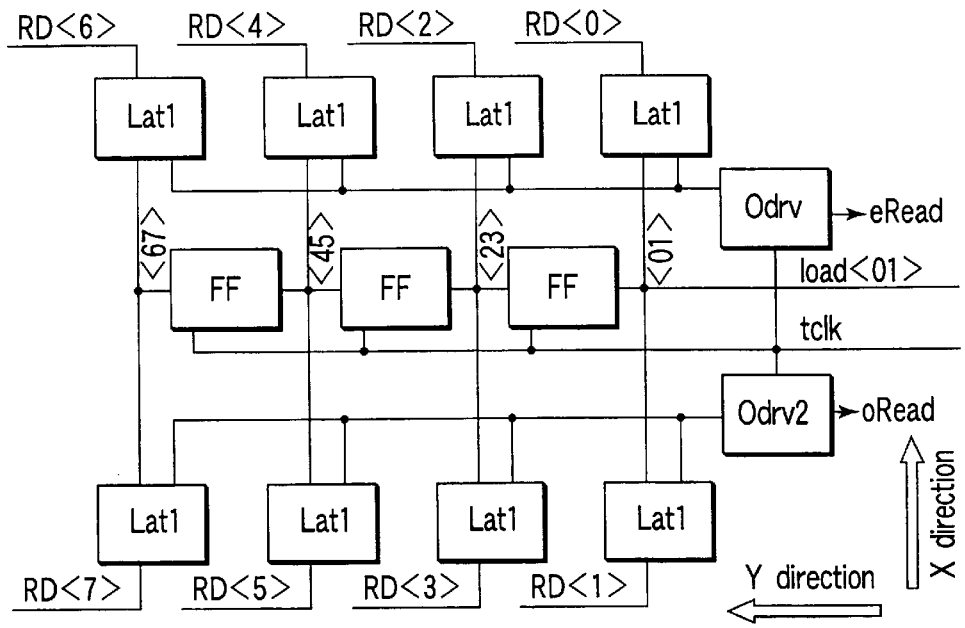
FIG. 12 is a circuit diagram showing one example of a read register provided in a high frequency clock synchronous memory according to a fifth embodiment of the present invention.
Figure 13:
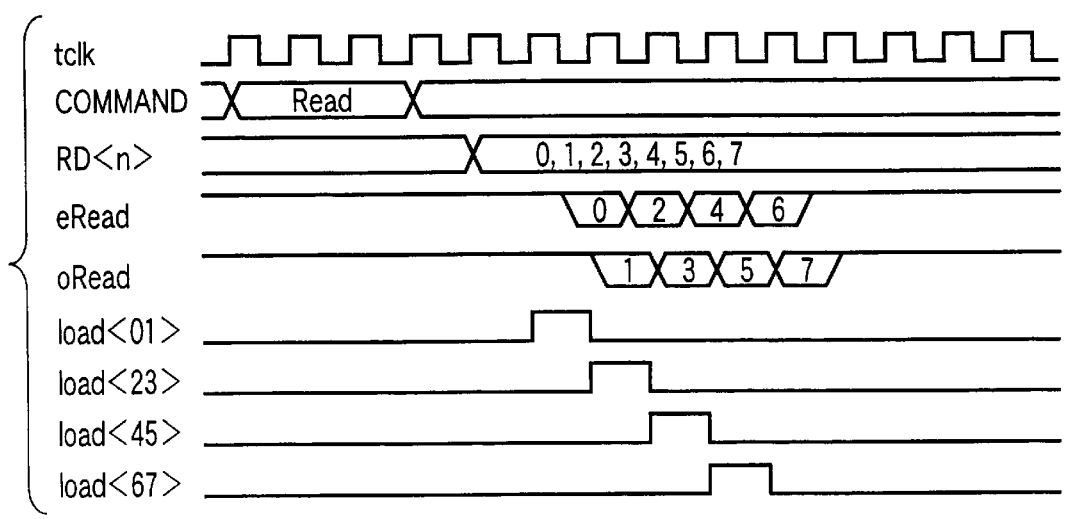
FIG. 13 is a timing waveform chart showing one example of a read operation of the read register shown in FIG. 12.

FIG. 12 is a circuit diagram showing one example of a read register provided in a high frequency clock synchronous memory according to a fifth embodiment of the present invention.

In the first to fourth embodiments, a circuit shown in FIG. 14 is used as a Lat circuit that controls internal read data. The circuit shown in FIG. 14 is a switching circuit that is switched by Load >n>, where an NMOS that receives Load >n> and PMOS that receives an inversion signal of Load >n> are inverted, respectively, between inverter sections that transfers read data RD >n>. Thus, a redundant junction capacity is added to an inverter section that transfers read data RD >n>.

Figure 16:
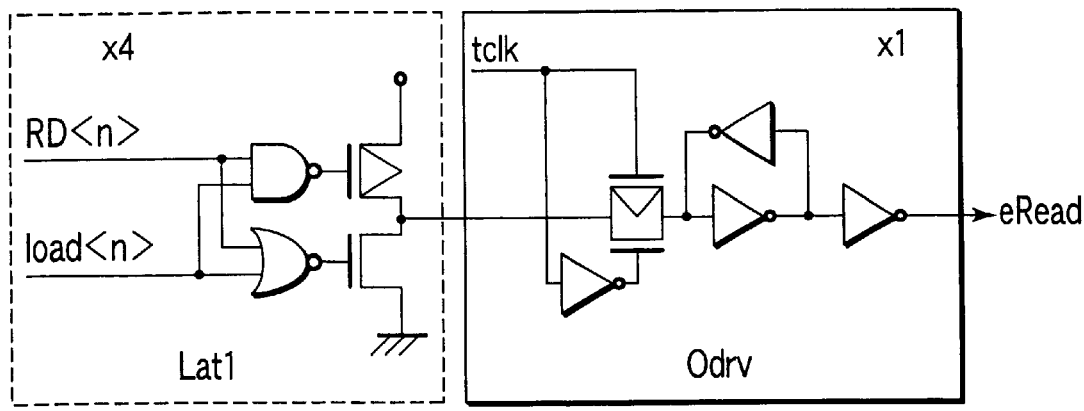
FIG. 16 is a circuit diagram showing one example of a Lat circuit and an Odriv circuit shown in FIG. 12.

In order to eliminate this circumstance, in the first embodiment, as shown in FIG. 16, a logic circuit for driving read data RD >n> based on Load >n> is provided. Then, a Lat1 circuit for driving an inverter that transfers read data RD >n> by this logic circuit is provided. In this manner, as compared with the circuit shown in FIG. 14, an inverter for transferring read data RD >n> can be directly connected to a power terminal, and read data can be delivered to an Odrv circuit without worrying about a junction capacity.

Figure 17:
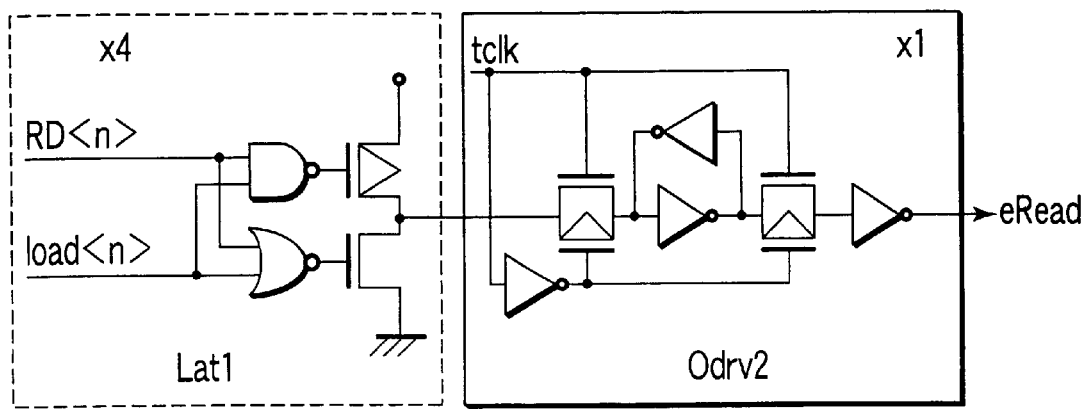
FIG. 17 is a circuit diagram showing one example of a Lat circuit and an Odriv circuit shown in FIG. 12.

Further, in the fifth embodiment, an Odrv circuit at the "odd" side is provided as an Odrv2 circuit shown in FIG. 17. The Odrv2 circuit shown in FIG. 17 makes it possible to shift "oRead" by a ¼ cycle. FIG. 7 is a timing waveform chart showing one exemplary read operation of the high frequency clock synchronous memory according to the fifth embodiment of the present invention.

As shown in FIG. 7, the read data RD >n> acquired by Load >n> is directly inputted to the Odrv circuit at the "even" side and to the Odrv2 circuit at the "odd" side. At the Odrv circuit at the "even" side, "eRead" is outputted at a fall of "tclk". In contrast, "oRead" is acquired at a fall of "tclk", and "oRead" is outputted at a fall of the "tclk".

In this manner, even and odd data converter circuits in the I/O circuit 4 can be eliminated.

Although the present invention has been described by way of the first to fifth embodiments, the present invention is not limited to a respective one of these embodiments. In carrying out the present invention, various modifications can occur without departing from the spirit of the invention.

In addition, the above described embodiments each can be, of course, carried out solely or in combination as required.

Further, the above described embodiments each include inventions at a variety of stages, and the inventions at a variety of stages can be excerpted according to a proper combination of a plurality of constituent elements disclosed in such each embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of memory cells;
a first latch circuit group including a plurality of latch circuits, the first latch circuit group latching n/2 of n-bit read data outputted from the memory cell array, and sequentially outputting the latched n/2 bit read data in response to sequentially shifted read control signals ("n" denotes a natural number);
a first output circuit, the first output circuit sequentially outputting the n/2 bit read data sequentially outputted from the first latch circuit group as n/2 bit serial read data in synchronism with a clock signal;
a second latch circuit group including a plurality of latch circuits, the second latch circuit group latching the remaining n/2 of n-bit read data outputted from the memory cell array, and sequentially outputting the remaining latched n/2 bit read data in response to the sequentially shifted read control signal; and
a second output circuit, the second output circuit sequentially outputting the remaining n/2 bit read data sequentially outputted from the second latch circuit group as the remaining n/2 bit serial read data in synchronism with the clock signal.

2. A semiconductor memory device comprising:
a memory cell array including a plurality of memory cells;
a first latch circuit group including a plurality of latch circuits, the first latch circuit group latching n/2 of n-bit read data outputted from the memory cell array, and outputting the latched n/2 bit read data in response to a read control signal;
a first output circuit, the first output circuit sequentially outputting the n/2 bit read data outputted from the first latch group as n/2 bit serial read data in synchronism with a clock signal;
a second latch circuit group including a plurality of latch circuits, the second latch circuit group latching the remaining n/2 of the n-bit read data outputted from the memory cell array, and outputting the remaining latched n/2 bit read data in response to the read control signal;
a second output circuit, the second output circuit sequentially outputting the n/2 bit read data outputted from the second latch circuit group as the remaining n/2 bit serial read data in synchronism with the clock signal; and
a flip-flop circuit group including a plurality of flip-flop circuits, the flip-flop circuit group outputting the read control signal to the first latch circuit group and the second latch circuit group while the read control signal is shifted in synchronism with the clock signal.

3. A semiconductor memory device comprising:
a memory cell array including a plurality of memory cells;
a first latch circuit group including a plurality of latch circuits, the first latch circuit group latching even number bit read data outputted from the memory cell array, and sequentially outputting the latched even number bit read data in response to sequentially shifted read control signals;
a first output circuit, the first output circuit sequentially outputting the even number bit read data sequentially outputted from the first latch circuit group as even number bit serial read data in synchronism with a clock signal;
a second latch circuit group including a plurality of latch circuits, the second latch circuit group latching odd number bit read data outputted from the memory cell array, and sequentially outputting the latched odd number bit read data in response to the sequentially shifted read control signals; and
a second output circuit, the second output circuit sequentially outputting the odd number bit read data sequentially outputted from the second latch circuit group as odd number bit serial read data in synchronism with the clock signal.

4. A semiconductor memory device comprising:
a memory cell array including a plurality of memory cells;
a first latch circuit group including a plurality of latch circuits, the first latch circuit group latching even number bit read data outputted from the memory cell array, and sequentially outputting the latched even number bit read data in response to sequentially shifted read control signals;
a first output circuit, the first output circuit sequentially outputting the even number bit read data sequentially outputted from the first latch circuit group as even number bit serial read data in synchronism with a clock signal;

a second latch circuit group including a plurality of latch circuits, the second latch circuit group latching odd number bit read data outputted from the memory cell array, and sequentially outputting the latched odd number bit read data in response to the sequentially shifted read control signals; and a flip-flop circuit group including a plurality of flip-flop circuits, the flip-flop circuit group outputting the read control signal to the first latch circuit group and the second latch circuit group while the read control signal is shifted in synchronism with the clock signal.

5. The device according to claim 2, wherein the flip-flop circuit group simultaneity outputs the read control signal to the first latch circuit group and the second latch circuit group while the read control signal is shifted in synchronism with the clock signal.

6. The device according to claim 4, wherein the flip-flop circuit group simultaneity outputs the read control signal to the first latch circuit group and the second latch circuit group while the read control signal is shifted in synchronism with the clock signal.

7. The device according to claim 2, wherein the flip-flop circuit group alternately outputs the read control signal to the first latch circuit group and the second latch circuit group while the read control signal is shifted in synchronism with the clock signal.

8. The device according to claim 4, wherein the flip-flop circuit group alternately outputs the read control signal to the first latch circuit group and the second latch circuit group while the read control signal is shifted in synchronism with the clock signal.

9. The device according to claim 2, wherein the flip-flop circuit group outputs the read control signal to the first latch circuit group and the second latch circuit group in an arbitrary order while the read control signal is shifted in synchronism with the clock signal.

10. The device according to claim 4, wherein the flip-flop circuit group outputs the read control signal to the first latch circuit group and the second latch circuit group in an arbitrary order while the read control signal is shifted in synchronism with the clock signal.

11. The device according to claim 2, wherein the flip-flop circuit group contains a flip-flop circuit group for the first latch circuit group and a flip-flop circuit group for the second latch circuit group.

12. The device according to claim 4, wherein the flip-flop circuit group contains a flip-flop circuit group for the first latch circuit group and a flip-flop circuit group for the second latch circuit group.

13. The device according to claim 2, wherein the flip-flop circuit group is common to the first latch circuit group and the second latch circuit group.

14. The device according to claim 4, wherein the flip-flop circuit group is common to the first latch circuit group and the second latch circuit group.

15. The device according to claim 1, wherein the first output circuit and the second output circuit each operate in the mutually in-phase to the clock signal.

16. The device according to claim 2, wherein the first output circuit and the second output circuit each operate in the mutually in-phase to the clock signal.

17. The device according to claim 3, wherein the first output circuit and the second output circuit each operate in the mutually in-phase to the clock signal.

18. The device according to claim 4, wherein the first output circuit and the second output circuit each operate in the mutually in-phase to the clock signal.

19. The device according to claim 1, wherein the first output circuit and the second output circuit each operate in the mutually reverse phase to the clock signal.

20. The device according to claim 2, wherein the first output circuit and the second output circuit each operate in the mutually reverse phase to the clock signal.

21. The device according to claim 3, wherein the first output circuit and the second output circuit each operate in the mutually reverse phase to the clock signal.

22. The device according to claim 4, wherein the first output circuit and the second output circuit each operate in the mutually reverse phase to the clock signal.

23. The device according to claim 1, wherein outputs of a plurality of latch circuits contained in the first latch circuit group each are connected in common to an even number bit read data wire connected to an input of the first output circuit, and wherein outputs of a plurality of latch circuits contained in the second latch circuit group each are connected in common to an odd number bit read data wire connected to an input of the second output circuit.

24. The device according to claim 2, wherein outputs of a plurality of latch circuits contained in the first latch circuit group each are connected in common to an even number bit read data wire connected to an input of the first output circuit, and wherein outputs of a plurality of latch circuits contained in the second latch circuit group each are connected in common to an odd number bit read data wire connected to an input of the second output circuit.

25. The device according to claim 3, wherein outputs of a plurality of latch circuits contained in the first latch circuit group each are connected in common to an even number bit read data wire connected to an input of the first output circuit, and wherein outputs of a plurality of latch circuits contained in the second latch circuit group each are connected in common to an odd number bit read data wire connected to an input of the second output circuit.

26. The device according to claim 4, wherein outputs of a plurality of latch circuits contained in the first latch circuit group each are connected in common to an even number bit read data wire connected to an input of the first output circuit, and wherein outputs of a plurality of latch circuits contained in the second latch circuit group each are connected in common to an odd number bit read data wire connected to an input of the second output circuit.

* * * * *